(12) United States Patent
Ben-Rubi

(10) Patent No.: US 10,482,969 B2
(45) Date of Patent: Nov. 19, 2019

(54) PROGRAMMING TO A CORRECTABLE AMOUNT OF ERRORS

(71) Applicant: Western Digital Technologies, Inc., San Jose, CA (US)

(72) Inventor: Refael Ben-Rubi, Rosh HaAyin (IL)

(73) Assignee: WESTERN DIGITAL TECHNOLOGIES, INC., San Jose, CA (US)

(*) Notice: Subject to any disclaimer, the term of this patent is extended or adjusted under 35 U.S.C. 154(b) by 0 days.

(21) Appl. No.: 15/874,839

(22) Filed: Jan. 18, 2018

(65) Prior Publication Data

US 2019/0198114 A1 Jun. 27, 2019

Related U.S. Application Data

(63) Continuation-in-part of application No. 15/851,277, filed on Dec. 21, 2017.

(51) Int. Cl.
| | |
|---|---|
| G11C 16/16 | (2006.01) |
| G11C 16/10 | (2006.01) |
| G11C 16/26 | (2006.01) |
| G11C 29/52 | (2006.01) |
| G06F 11/10 | (2006.01) |
| G11C 16/34 | (2006.01) |

(52) U.S. Cl.
CPC .......... G11C 16/10 (2013.01); G06F 11/1068 (2013.01); G11C 16/26 (2013.01); G11C 16/3459 (2013.01); G11C 29/52 (2013.01)

(58) Field of Classification Search
CPC ..... G11C 16/10; G11C 16/3459; G11C 16/26; G11C 29/52; G06F 11/1068; G06F 11/073; G06F 11/1072; G06F 11/1076
See application file for complete search history.

(56) References Cited

U.S. PATENT DOCUMENTS

| | | | |
|---|---|---|---|
| 8,111,554 B2* | 2/2012 | Lutze | G11C 16/12 365/185.14 |
| 2017/0139761 A1* | 5/2017 | Song | G06F 11/0793 |

* cited by examiner

*Primary Examiner* — David Lam
(74) *Attorney, Agent, or Firm* — Kunzler Bean & Adamson, PC

(57) ABSTRACT

Apparatuses, systems, methods, and computer program products are disclosed for distributed program operation. One apparatus includes a non-volatile storage controller that identifies a threshold number of bit flips that can be corrected in an amount of read data and a memory die comprising a plurality of non-volatile memory cells. Here, the memory die receives the threshold number of bit flips from the non-volatile storage controller, programs data to a set of the non-volatile memory cells over a first number of program loop cycles, and programs the data to the set of non-volatile memory cells over an additional number of program loop cycles in response to the amount of bit flips in the set of memory cells exceeding the threshold number of bit flips.

20 Claims, 15 Drawing Sheets

Table 1: Time tag per page → 900

| Page 1 | Page 2 | Page 3 | Page 4 | Page 5 | Page 6 | Page 7 |
|---|---|---|---|---|---|---|
| 694 sec | 004 sec | 022 sec | 037 sec | 423 sec | 056 sec | 077 sec |

905 →  (header row)
910 →  (data row)

Table 2: Sorted time tag per page → 920

| Page 2 | Page 3 | Page 4 | Page 6 | Page 7 | Page 5 | Page 1 |
|---|---|---|---|---|---|---|
| 004 sec | 022 sec | 037 sec | 056 sec | 077 sec | 423 sec | 694 sec |

905 →  (header row)
910 →  (data row)

Table 3: LBA Write Access Count → 950

| LBA | Usage Count |
|---|---|
| 0x100 | 235 |
| 0x1054 | 166 |
| 0x23 | 123 |
| 0x2019 | 87 |
| 0x1572 | 1 |

PROGRAMMING TO A CORRECTABLE AMOUNT OF ERRORS

CROSS-REFERENCES TO RELATED APPLICATIONS

This is a continuation-in-part application of and claims priority to, U.S. patent application Ser. No. 15/851,277 entitled "DISTRIBUTED PROGRAM OPERATION" and filed on 21 Dec. 2017 for Refael Ben-Rubi, et al., which is incorporated herein by reference in its entirety, for all purposes.

TECHNICAL FIELD

The present disclosure, in various embodiments, relates to interrupting a storage operation and more particularly relates to programming to a correctable amount of errors.

BACKGROUND

Solid-state storage, such as NAND flash memory, stores data in arrays of storage cells, which, in the case of flash memory, are formed from floating-gate transistors. NAND flash memory devices return previously stored data by reading a set of bits from cells in an array. A memory device may include one or more chips, and a chip may include one or more arrays of memory cells (e.g., memory die).

The time required to erase data from a cell is typically longer than the time required to write data to a cell and typically much longer than the time required to read data from a cell. Write/program times are typically longer than read times, but shorter than erase times. One operation that is most critical to perceived performance is the program of data into flash. While erase times are typically much longer than program times, the write command is more often invoked than the erase command (e.g., since an entire erase block may be erased at a time, while single word lines may be programmed at a time).

One problem in program performance, is that many of the resources (e.g., hardware and/or firmware) that are allocated to single write operation may not be released for a relatively long time, as they may be allocated until the program operation is completely ended. As a result, a host may be unable to access the memory device until the program operation is confirmed and the resources released.

One challenge with current high-performance program operations is the peak power that is consumed during that program operation. When two or more die work in parallel, their peak power consumption accumulates and can cause a reduction of the voltage of the source power supply, resulting in power drop causing the memory device to be non-functioning and consequential loss of service to user.

SUMMARY

Various embodiments are disclosed, including apparatuses, systems, methods, and computer program products for programming to a correctable amount of errors.

In one embodiment, an apparatus includes a non-volatile storage controller that identifies a threshold number of bit flips that can be corrected in an amount of read data and a memory die comprising a plurality of non-volatile memory cells. The memory die receives the threshold number of bit flips from the non-volatile storage controller and programs data to a set of the non-volatile memory cells over a first number of program loop cycles. If the amount of bit flips in the set of memory cells exceeds the threshold number of bit flips, then the memory die programs the data to the set of non-volatile memory cells over an additional number of program loop cycles.

A method, in one embodiment, includes receiving, from a non-volatile storage controller, a threshold number of bit errors that are correctable by the controller. The method includes programming a set of non-volatile memory cells with a number of first program pulses. The method includes reading data stored to the set of non-volatile memory cells after the number of first program pulses. The method includes analyzing whether a read number of bit errors exceeds the threshold number of bit errors. The method includes notifying the non-volatile storage controller that the set of non-volatile memory cells is successfully programmed based on the result of the analysis.

Another apparatus, in various embodiments, includes means for receiving, from a storage controller, a correctable number of bit errors and means for receiving, from the storage controller, source data to be programmed to a set of memory cells. Said apparatus also includes means for programming the set of memory cells and means for reading data stored to the set of memory cells after a program loop cycle. The apparatus further includes means for analyzing whether an amount of bit errors in data read from the set of memory cells is correctable based on the correctable number of bit errors. The apparatus additionally includes means for signaling, to the storage controller, completion of a program command based on the analysis.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which:

FIG. 9 is a block diagram illustrating various embodiments of tables used for distributed program operations;

DETAILED DESCRIPTION

Figure 1A:
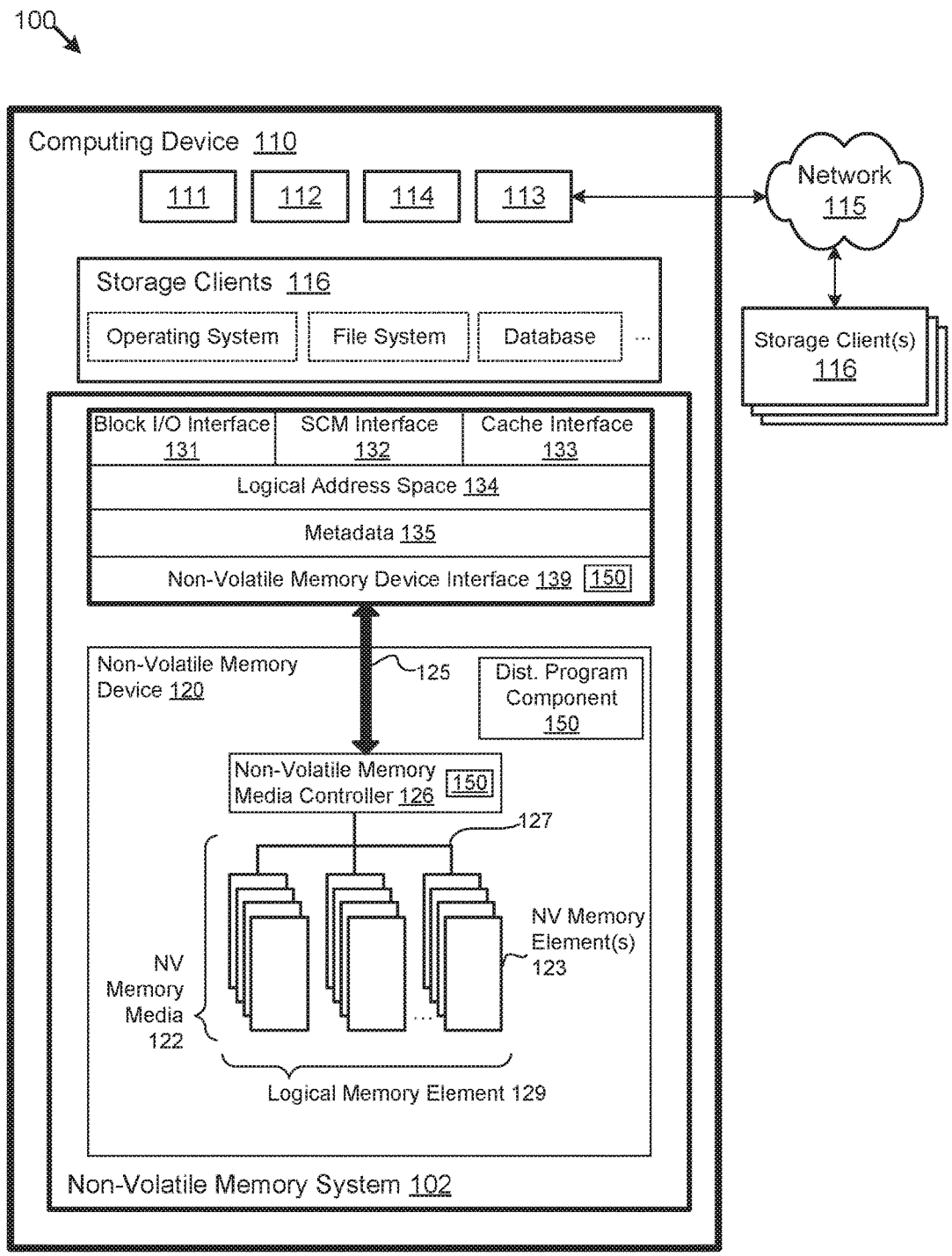
FIG. 1A is a schematic block diagram illustrating one embodiment of a system for distributed program operation.

Aspects of the present disclosure may be embodied as an apparatus, system, method, or computer program product. Accordingly, aspects of the present disclosure may take the form of an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodiment on one or more non-transitory computer-readable storage media storing computer-readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions that may, for instance, be organized as an object, procedure, or function. Nevertheless, the executables of an identified module need not be physically located together, but may comprise disparate instructions stored in different locations that, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer-readable and/or executable storage media. Any combination of one or more computer-readable storage media may be utilized. A computer-readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer-readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object-oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like.

In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

In addition, as used herein, the term "set" can mean "one or more," unless expressly specified otherwise. The term "sets" can mean multiples of or a plurality of "one or mores," "ones or more," and/or "ones or mores" consistent with set theory, unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1A is a block diagram of one embodiment of a system 100 including a distributed program component 150 for a controller 126 of a non-volatile memory device 120. The distributed program component 150 may be part of and/or in communication with a controller 126, a non-volatile memory element 123, a device driver, or the like. The distributed program component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer-readable storage medium 114. The computer-readable storage medium 114 may comprise executable instructions configured to cause the computing device 110 (e.g., processor 111) to perform steps of one or more of the methods disclosed herein. Alternatively, or in addition, the distributed program component 150 may be embodied as one or more computer-readable instructions stored on the non-transitory storage medium 114.

The non-volatile memory system 102, in the depicted embodiment, includes a distributed program component 150. In certain embodiments, the distributed program component 150 is configured to receive, from a host, an instruction to write data, program a wordline (or page or other set of non-volatile memory cells) of memory cells to a partial program state, and signal completion of the instruction to write data to the host. At a later time, the distributed program component 150 programs the wordline (or page or other set of non-volatile memory cells) to a fully programmed state, e.g., after performing one or more intervening operations. In one embodiment, the distributed program component 150 is configured to program a set of non-volatile memory with a first number of program cycles and indicate (e.g., to a host) that the page is partially programmed. Here, the distributed program component 150 may use incremental step pulse programming to write data to the non-volatile memory. Here, the first number of program cycles (also referred to as program "pulses") is less than the amount needed to fully program the page of non-volatile memory. The distributed program component 150 is also configured to program the page with a second number of program cycles after a predetermined time, wherein one or more other storage operations are performed during the predetermined time, and indicate (e.g., to the host) that the page is fully programmed. Here, the distributed program component 150 may read data from the partially programmed page into an internal RAM or write buffer (e.g., the XDL transfer buffer), wherein the data in the internal RAM or write buffer is used to fully program the page.

In another embodiment, the distributed program component 150 is configured to: receive a write command from a host, lower a program verify voltage for the TLC cell, program a set of the data recording elements using the lowered program verify voltage, acknowledge the write command; restore the program verify voltage, and program the page using the restored program verify voltage. In such an embodiment, the distributed program component 150 further reads page data from the page of data recording elements prior to programming the page using the restored program verify voltage. Here, programming the page using the restored program verify voltage comprises programming the page with the read page data. Moreover, the distributed program component 150 may wait a predetermined period between acknowledging the write command and programming the page using the restored program verify voltage. In certain embodiments, the lowered program verify voltage is selected based on a number of errors in the page correctible using an error correction code ("ECC").

In one embodiment, the distributed program component 150 may comprise logic hardware of one or more non-volatile memory devices 120, such as a controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the distributed program component 150 may comprise executable software code, such as a device driver or the like, stored on the computer-readable storage medium 114 for execution on the processor 111. In a further embodiment, the distributed program component 150 may include a combination of both executable software code and logic hardware.

In one embodiment, the distributed program component 150 is configured to receive I/O requests from a device driver or other executable application via a bus 125 or the like. The distributed program component 150 may be further configured to transfer data to/from a device driver and/or storage clients 116 via the bus 125. Accordingly, the distributed program component 150, in some embodiments, may comprise and/or be in communication with one or more direct memory access (DMA) modules, remote DMA modules, bus controllers, bridges, buffers, and so on to facilitate the transfer of memory/storage requests and storage operations of associated program data. In another embodiment, the distributed program component 150 may receive storage requests as an API call from a storage client 116, as an IO-CTL command, or the like.

As used herein, a storage operation (e.g., an erase procedure, a program/write procedure, a read procedure), may comprise one or more phases, segments, steps, pulses, and/or other portions which together satisfy a predetermined goal and/or result (e.g., erasing data from storage cells, programming data to storage cells, reading data from storage cells, or the like). By default, in certain embodiments, a storage operation may be completed by executing phases, segments, steps, pulses, and/or other portions of the storage operation consecutively (e.g., without interruption). From the perspective of the computing device 110, a storage client 116, the non-volatile memory media controller 126, and/or the non-volatile memory controller 124, a storage operation may be implemented or completed in response to a single command or request, even if the storage operation uses a plurality of separate, independent phases, segments, steps, pulses, or other portions from the perspective of the non-volatile memory media 122 or from a non-volatile memory element 123.

For example, a storage client 116 may send a write request to store data in the non-volatile memory device 120 or a trim request to erase data from the non-volatile memory device 120, the non-volatile memory controller 124 may select one or more erase blocks of the non-volatile memory media 122 to erase for garbage collection as part of a storage capacity recovery operation, or the like. A program procedure for the non-volatile memory media 122 may include a single program operation executed using a single program command (e.g., including address information, data of the write request, or the like) for a respective memory element 123 (and/or for several memory elements 123 in an array) associated with the request, which may cause the non-volatile memory element(s) 123 to perform a program operation comprising a plurality of electrical pulses of varying voltage levels until the single program operation either succeeds or fails, such as incremental step pulse programming.

Each iteration of applying an increased voltage to program memory cells may be referred to as a loop (e.g., an erase loop, a program loop, or the like). On each iteration, the wordline, page, or other set of storage cells receives an electric pulse with a predefined voltage. For a program operation, each pulse may be configured to push electrons into the floating gate while a pulse of an erase operation may push electrons out of the floating gate, or the like.

Each iteration or pulse may be applied for a fixed time period or predetermined duration (e.g., 600-700 microseconds or the like). The voltage applied during an operation may be configured to gradually increase (e.g., ramp up) during the first pulse of an operation. A ramp up voltage may be performed to mitigate the damage on oxide by slowly applying the higher voltages to the cells, or the like. High voltages may cause damage to the oxide layers that separate the floating gate from the other layers.

A program operation may include N number of pulses (e.g., a maximum loop count of 16 or the like). Conventionally, a loop count N for the non-volatile memory media 122, in certain embodiments, is set high enough to ensure that a full program operation successfully completes. In some embodiments, the distributed program component 150 may temporarily set the loop count N to a lower number, $N_1$, in order to distribute the program operation into two or more stages. In other embodiments, the distributed program component 150 stores the loop count $N_1$, which is used in the first stage of a distributed programming operation.

Here, the first loop count $N_1$ is the maximum loop count for the first program stage of the distributed program operation and $N_1<N$. In various embodiments, the loop count $N_1$ is selected based on a number of pulses needed to place the memory cells into a partially programmed state, where the data to be programmed to the memory cells is readable with an amount of errors that is correctable using an error correction code ("ECC") component or similar component. In one embodiment, a low-density parity-check ("LDPC") code is used for error correction. The loop count $N_1$ may vary based on a type and manufacturer of the non-volatile media 122, a type of ECC component, an age (e.g., amount of usage) of the non-volatile media 122, and the like. In certain embodiments, the loop count $N_1$ is determined empirically. Moreover, the loop count $N_1$ may be updated as the non-volatile media 122 ages.

Additionally, the distributed program component 150 may use a second loop count $N_2$ for a second stage of the distributed programming operation, where $N_2<N$. Generally, fewer program pulses are needed to program the cells from the partial program state to the fully programmed state, and thus $N_2<N_1$. Moreover, additional stages of the distributed programming operation may use the loop count $N_2$ or another loop count $N_3$, where $N_3<N$. In some embodiments, the sum of $N_1$ and $N_2$ is greater than or equal to N. By reducing the number of programming pulses performed at a time, the peak power consumption is reduced.

According to various embodiments, a controller 126 in communication with one or more distributed program components 150 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more controllers 126.

A device driver may present a logical address space 134 to the storage clients 116 through one or more interfaces. As discussed above, the logical address space 134 may comprise a plurality of logical addresses, each corresponding to respective media locations of the one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The controller 126 is part of and/or in communication with one or more non-volatile memory devices 120. Although FIG. 1A depicts a single non-volatile memory device 120, the disclosure is not limited in this regard and could be adapted to incorporate any number of non-volatile memory devices 120.

The non-volatile memory device 120 may comprise one or more memory elements 123 of non-volatile memory media 122, which may include, but is not limited to: random access memory (RAM), resistive RAM (ReRAM), Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape, or the like), optical storage media, and/or the like, among other devices that are possible and contemplated herein. The one or more memory elements 123 of non-volatile memory media 122, in certain embodiments, comprise storage class memory (SCM).

While legacy technologies, such as NAND flash, may be block and/or page addressable, storage class memory, in one embodiment, is byte addressable. In further embodiments, SCM may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, and/or the like. Further, the non-volatile memory device 120, in various embodiments, may comprise a non-volatile recording device, a non-volatile memory device, a non-volatile storage device, and/or the like.

The non-volatile memory media 122 may comprise one or more non-volatile memory elements 123, which may include, but are not limited to: chips, packages, planes, die, and/or the like. A controller 126 may be configured to manage data operations on the non-volatile memory media 122, and may comprise one or more processors, programmable processors (e.g., FPGAs), ASICs, micro-controllers, or the like. In some embodiments, the controller 126 is configured to store data on and/or read data from the non-volatile memory media 122, to transfer data to/from the non-volatile memory device 120, and so on.

The controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The controller 126 may organize a block of wordlines within a non-volatile memory element 123, in certain embodiments, using addresses of the wordlines, such that the wordlines are logically organized into a monotonically increasing sequence (e.g., decoding and/or translating addresses for wordlines into a monotonically increasing sequence, or the like). In a further embodiment, wordlines of a block within a non-volatile memory element 123 may be physically arranged in a monotonically increasing sequence of wordline addresses, with consecutively addressed wordlines also being physically adjacent (e.g., WL0, WL1, WL2, . . . WLN).

The controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library.

A device driver may be further configured to provide a cache interface 133 for caching data using the non-volatile memory system 102. A device driver may further comprise a non-volatile memory device interface 139 that is configured to transfer data, commands, and/or queries to the controller 126 over a bus 125, as described above.

Figure 1B:
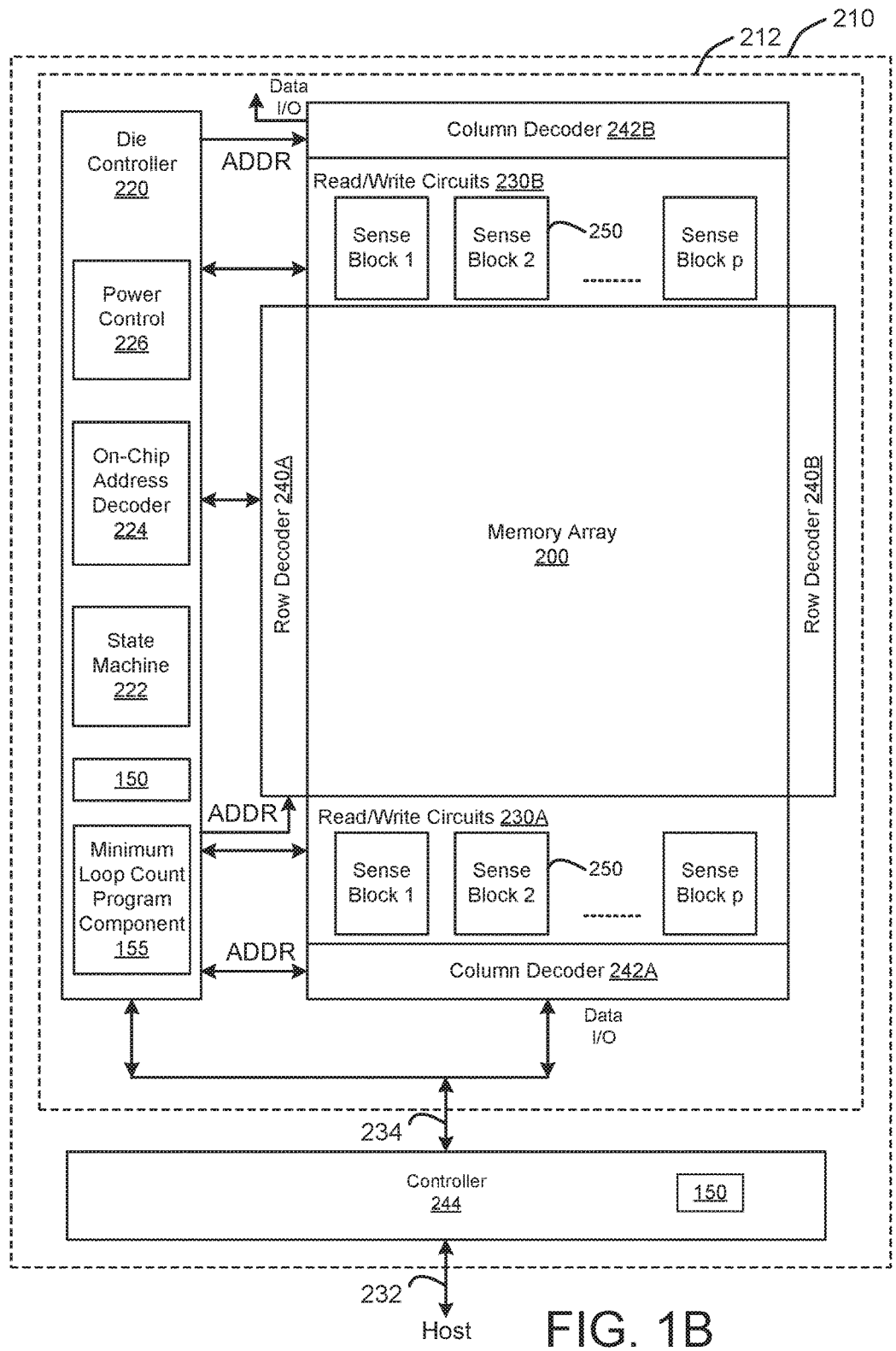
FIG. 1B is a schematic block diagram illustrating another embodiment of a system for distributed program operation.

FIG. 1B illustrates an embodiment of a non-volatile storage device 210 that may include one or more memory die and/or chips 212. The non-volatile storage device 210 may be one embodiment of the non-volatile memory device 120, described above. Memory die 212, in some embodiments, includes an array (e.g., two-dimensional (2D), three dimensional (3D), or the like) of memory cells 200, die controller 220, and read/write circuits 230A/230B. In certain embodiments, the array of memory cells 200 is organized into erase blocks and pages. For example, the array of memory cells 200 may include multiple erase blocks, each erase block including one or more pages.

As used herein, an erase block refers to the smallest unit that can be erased in a single erase command. As used herein, a page refers to the smallest unit that can be programmed by (e.g., written to) a single write/program command and/or operation. This may also be the smallest unit that can be read at a time, although the controller may parse the page to provide a requested portion thereof to the host. Note, however, that the page size of the memory die/chip 212 may be smaller than a size assumed by the host. For example, the host may send data in units of 16 kB (e.g., to minimize data write-amplification), while the memory die/chip 212 may be capable of programming a 4 kB page of data (e.g., programming a 16 kB page of host data to 4 different 4 kB physical pages on different die, die planes, chips, or the like). Here, the physical page size is one-quarter the logical page size used by the host. Moreover, the memory die/chip 212 may be capable of programming multiples of the 4 kB die-level page at once, e.g., up to the 16 kB host-level page size, or the like. Additionally, the memory die/chip 212 may include multiple die planes, each plane capable of programming a page in parallel. For example, the memory die/chip 212 may contain two die planes and thus capable of programming 2×16 kB pages at a time, or the like.

Generally, a page of cells is smaller than an erase block and an erase block includes multiple pages. Note that for multi-level cells (MLC) and triple-level cells (TLC), or other memory cells where each cell stores more than one bit of information, a wordline of cells may store multiple pages of data. For example, a MLC wordline may include both an upper page (e.g., 4 kB, 8 kB, 16 kB, or the like) and a lower page (e.g., 4 kB, 8 kB, 16 kB, or the like) allowing for two pages of data to be stored in the wordline. As another example, a TLC wordline may include the following pages: an upper page, a middle page, and a lower page allowing for three pages of data to be stored in the wordline. In contrast, a SLC wordline only stores one page. Note that in the above examples, different amounts of data can be stored to the same number of memory cells (e.g., same wordline size) depending on the number of bits stored per cell.

In one embodiment, access to the memory array 200 by various peripheral circuits is implemented in a symmetric fashion, on opposite sides of the array, so that the densities of access lines and circuitry on each side are reduced by half. The read/write circuits 230A/230B, in a further embodiment, can include multiple sense blocks 250 that allow a page of memory cells to be read and/or programmed in parallel.

The memory array 200, in various embodiments, is addressable using wordlines via row decoders 240A/240B and using bit lines via column decoders 242A/242B. In some embodiments, a controller 244 is included in the same memory device 210 (e.g., a removable storage card or package) as the one or more memory die 212. The controller 244 may be one embodiment of the non-volatile memory media controller 126. Commands and data are transferred between the host and controller 244 via lines 232 and between the controller and the one or more memory die 212 via lines 234. One implementation can include multiple chips 212.

Die controller 220, in one embodiment, cooperates with the read/write circuits 230A/230B to perform memory operations on the memory array 200. The die controller 220, in certain embodiments, includes a minimum loop count program component 155, a state machine 222, and an on-chip address decoder 224. In one embodiment, the die controller 220 and/or the state machine 222 comprises at least a portion of the distributed program component 150. In a further embodiment, the controller 244 comprises at least a portion of the distributed program component 150. In various embodiments, one or more of the sense blocks 250 comprises at least a portion of the distributed program component 150. The page program component(s) 150 discussed with reference to FIG. 1B may be similar to the page program component(s) 150 discussed with reference to FIG. 1A.

The state machine 222, in one embodiment, provides chip-level control of memory operations. The on-chip address decoder 224 provides an address interface to convert between the address that is used by the host or a memory controller to the hardware address used by the decoders 240A, 240B, 242A, and 242B. In certain embodiments, the state machine 222 includes an embodiment of the minimum loop count program component 155.

The distributed program component 150, in certain embodiments, is embodied as software in a device driver and/or hardware in a controller 244. Moreover, the minimum loop count program component 155, in certain embodiments, is embodied as hardware in the die controller 220 and/or state machine 222. In one embodiment, one or any combination of die controller 220, minimum loop count program component 155, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

The distributed program component 150 distributes the program operation of a MLC or TLC cell in the time domain, e.g., by splitting the operations into several stages. A first step of the distributed program operation includes controlling the write circuitry (or other program hardware) to apply voltage pulses to the page (physical) to be programmed (referred to as the "programmed page") until part of the final charge is programmed to the floating gates. This is referred to as "partially programming" the programmed page, and is a first programming stage of the distributed program operation.

Note that because the partially programmed charge is not the final charge, there will be error bits in the page. Here, error bits are caused by the partially programmed charge not matching the final charge needed to accurately represent the programmed data. However, there will be sufficient charge stored for data to be read from the partially programmed page with a correctible amount of bit errors. In some embodiments, the partially programmed charge is less than the final programmed charge. This first stage is performed in response to a host (e.g., a host computing device 110) issuing a write command. Here, the write command may include at least one logical block address ("LBA") and data to be written to the LBA(s). In certain embodiments, LBAs that are used with high frequency are assigned to an area of the memory media where distributed programming occurs.

The number of program pulses in the first stage is lower than the maximum that is needed to make the page "fully" programmed. The number of program pulses (e.g., $N_1$ discussed above) is such that a sense/decode operation will fix the error bits. However, the partial programmed charge will drift over time and after a period of time the sense/decode operation will no longer be able to fix the error bits. Thus, the partial programmed state is valid for the finite period of time into the near future. Generally, this period of time is expected to be minutes to hours. In certain embodiments, the data may remain valid for one or more days. The specific amount of time (e.g., the "validity period") may be selected based on various factors, such as the process used, the parameters used when programming (e.g., voltages, voltage steps, pulse duration, verify voltages, or the like), the temperature, the age of the media, or the like. For example, memory cells that has endured many P/E cycles tends to have faster voltage drift and hence a shorter data retention time than memory cells that has endured few P/E cycles.

The distributed program component 150 maintains a table (or other suitable data structure) of pages that are partially programmed, referred to herein as "partial program table." In one embodiment, the partial program table is stored in volatile memory onboard the non-volatile memory media 122, such as a DRAM, SRAM, DDR latch, or the like. Alternatively, the partial program table may be programmed to NAND if it is too big for the volatile memory. A second step of the distributed program operation includes adding the programmed page to the partial program table and indicating that the specific page is partially programmed. In some embodiments, the distributed program component 150 indicates a validity period for the partially programmed page, as discussed in detail below. In various embodiments, the distributed program component 150 maintains multiple partial program tables, for example one partial program table for each memory die 212, or the like.

A third step of the distributed program operation includes the distributed program component 150 indicating to the host (e.g., the host computing device 110) that the LBA(s) that correspond to that programmed page are successfully programmed. Here, acknowledging the write operation may be implementation-specific, as different host interfaces may use different mechanisms to acknowledge the write. Examples of different interfaces include, but are not limited to, NVMe ("Non-Volatile Memory Express") over PCI, eMMC ("embedded MultiMediaCard"), and the like. Depending on the interface, the distributed program component may set a status bit/register that is polled by the host, send a response message to the host, or the like.

In one embodiment, the distributed program component 150 uses a status bit that host can read, to indicate successful completion of the write operation, even though the data is only partially programmed. Optionally, the distributed program component 150 may indicate to the host that the LBA is in a partial program state. At this point, the host or a storage client 116 (such as OS) can begin another access operation to the memory device flash, such as a write operation or a read operation. Beneficially, the host is able to use the channel sooner (e.g., issue new storage operation commands to a memory die 212) using the distributed program operation, as discussed below with reference to FIG. 6. Accordingly, the distributed program operation allows for higher throughput and better program operation performance.

The distributed program operation includes a fourth step of the distributed program component 150 scanning its partial program table(s), for example at periodic intervals, to identify pages that are partially programmed. In response to identifying a partially programmed page, the distributed program component 150 may program the page to the final charge level that is needed in the device. Doing so includes a second programming stage, wherein additional voltage pulses are applied to the page until the final charge is programmed to the floating gates. In certain embodiments, page data is read from the partially programmed page as part of the second programming stage, wherein programming the page to the final charge level includes programming the page using the read page data.

In one embodiment, reading the stored page data includes performing a "hard" read operation. In another embodiment, reading the stored page data includes performing a "soft" read operation. In certain embodiments, reading the stored page data may include both hard-read sensing and soft-read sensing, for example to maximize performance of an error correction scheme, such as an LDPC scheme. As used herein, a "hard" read operation refers to comparing the stored charge to a set of read voltage threshold to derive a Boolean value (e.g., binary '0' or '1') indicating whether a read threshold was satisfied. In contrast, a "soft" read operation returns more information than just a single Boolean value. In some embodiments, the soft read operation returns a probability or confidence that the corresponding Boolean value is accurate. In certain embodiments, the soft read operation returns a multiple bit value indicating whether multiple soft read thresholds are satisfied. In other embodiments, the soft read operation returns information regarding a sub-state in which a stored charge for the cell resides. Accordingly, an ECC decoder may use a combination of hard-read information (resulting from a "hard" read operation) and soft-read information (resulting from a "soft" read operation) when reading the data stored by the wordline or other set of memory cells.

As discussed above, during a second programming stage of the distributed program operation, the distributed program component 150 may apply up to a second number of program pulses (e.g., $N_2$ discussed above) to program the page to its final charge. This is referred to as "fully programming" the page. In certain embodiments, the distributed program component 150 reads the partially programmed page (recall, a page in a partial program state stores sufficient charge for the error bits to be correctable) and programs the read value to the final charge level. In certain embodiments, the second programming stage uses lower program voltages to avoid program disturbs of neighboring pages.

In certain embodiments, the non-volatile memory media 122 is limited to a sequential page programming order. Here, the physical pages must be programmed sequentially, rather than in a random programming order. In such embodiments, the distributed program component 150 will partially program each page in the required order. Moreover, the distributed program component may also fully program each page to its final charge state, at the later time.

In one embodiment, the distributed program component 150 may "refresh" the data stored in the partially programmed page prior to fully programming the page. For example, the distributed program component 150 may apply a small number of program pulses (e.g., one or two) in order to adjust the charge level stored in the floating gate to a level closer to the final charge value without fully programming the page. The distributed program component 150 may refresh the data stored in the partially programmed page in order to reset or extend the validity period. Later, the distributed program component 150 may fully program the page upon expiration of the reset or extended validity period.

As a fifth step of the distributed program operation, the distributed program component 150 updates its partial program table(s) to indicate that the programmed page is now fully programmed. In one embodiment, indicating that the programmed page is now fully programmed includes removing addresses corresponding to the programmed page from the partial program table(s). This fifth step occurs after the distributed program component 150 fully programs the page. Where the distributed program component 150 has informed the host that the LBA corresponding to the programmed page is in a partially programmed state, the distributed program component 150 also informs the host that the LBA is now in a fully programmed state.

The minimum loop count program component 155 compares data read from a page during a program-verify step of the incremental step pulse programming to the source data and identifies the number of bit errors, such as bit flips, in the read data as compared to the source data. The minimum loop count program component 155 receives a threshold number of bit errors that can be corrected in the read data, for example by an ECC decoder in the controller 126, distributed program component 150, and/or a controller 244, and stored this, for example in internal RAM. In one embodiment, the threshold number refers to the number of bit errors in a physical and/or die-level page that can be corrected using the error correction code. Once the number of bit errors in the data read from the page being programmed becomes less than or equal to the threshold number of bit errors, then the minimum loop count program component 155 indicates that the page is programmed.

Beneficially, the minimum loop count program component 155 may signal completion of the program operation sooner than would occur when using program verify voltages to confirm that the source data is programmed to the page. By increasing the accumulative number of programming pulses only until the data read from the page is correctable, the minimum loop count program component 155 facilitates programming a correctable page with a minimum program loop count.

In various embodiments, the minimum loop count program component 155 tracks the number of program pulses required to reach the correctable page. The minimum loop count program component 155 may then report this number to the storage controller 244. In some embodiments, the minimum loop count program component 155 receives, from the storage controller 244, a number of program pulses to perform without verifying a programmed voltage level. The number of program pulses to perform without verifying a programmed voltage level may be based on the reported numbers of program pulses required to reach a correctable page for the memory die 212.

Figure 2:
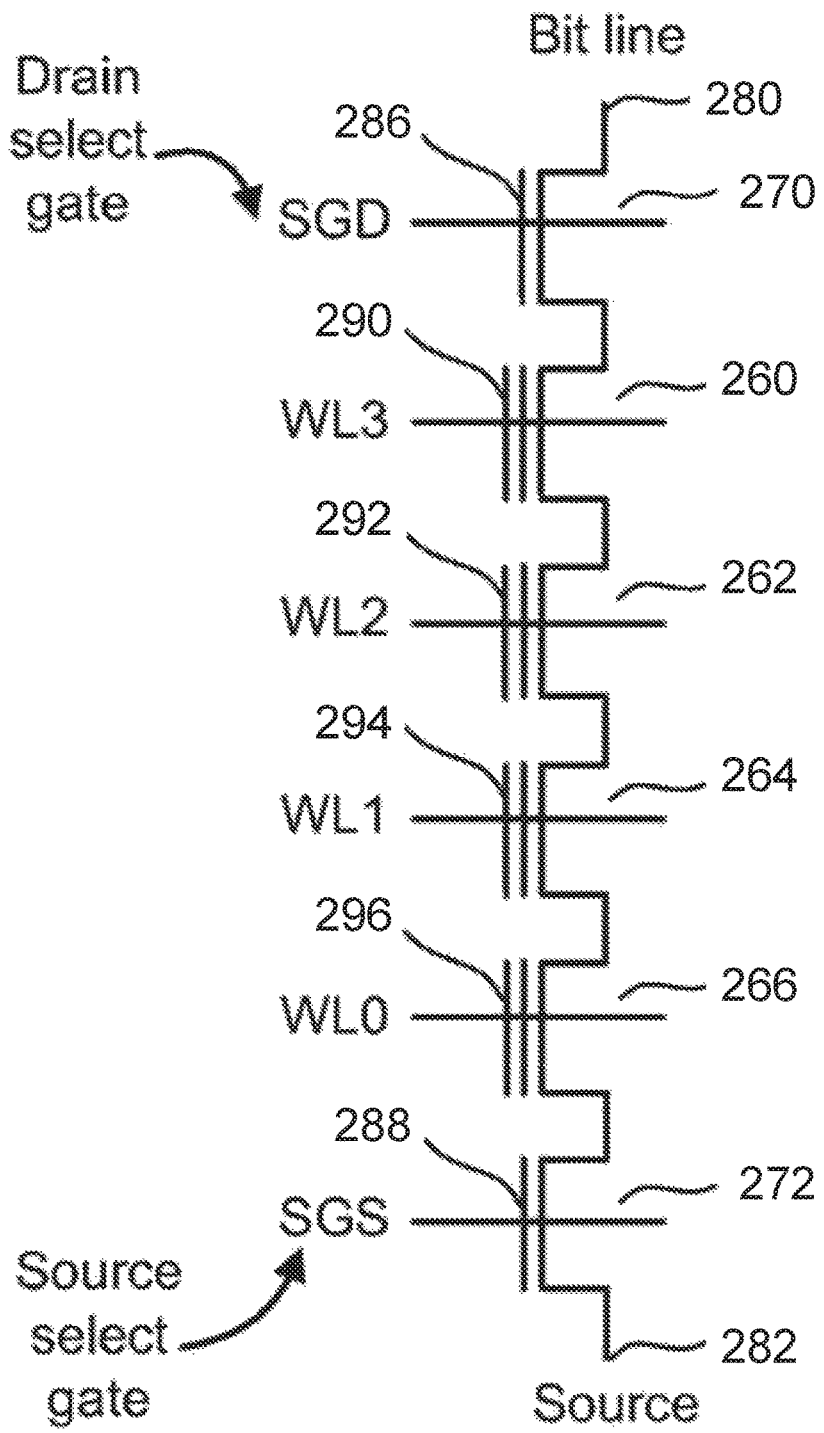
FIG. 2 is a schematic block diagram illustrating one embodiment of a string of storage cells.

FIG. 2 depicts one embodiment of a NAND string 255 comprising a plurality of storage elements. The NAND string 255 depicted in FIG. 2, in some embodiments, includes four transistors 260, 262, 264, and 266 connected in series and located between a first select transistor 270 and a second select transistor 272. In some embodiments, a transistor 260, 262, 264, and 266 includes a control gate and a floating gate. A control gate 290, 292, 294, and 296, in one embodiment, is connected to, or comprises a portion of, a wordline. In a further embodiment, a transistor 260, 262, 264, and 266 is a storage element, storage cell, or the like, also referred to as a memory cell. In some embodiments, a storage element may include multiple transistors 260, 262, 264, and 266.

The first select transistor 270, in some embodiments, gates/connects the NAND string connection to a bit line 280 via a drain select gate SGD. The second select transistor 272, in certain embodiments, gates/connects the NAND string connection to a source line 282 via a source select gate SGS. The first select transistor 270, in a further embodiment, is controlled by applying a voltage to a corresponding select gate 286. The second select transistor 272, in some embodiments, is controlled by applying a voltage to corresponding select gate 288.

As shown in FIG. 2, the source line 282, in one embodiment, is connected to the sources of each transistor/storage cell 260, 262, 264, and 266 in the NAND string 255. The NAND string 255, in some embodiments, may include some storage elements 260, 262, 264, and 266 that have been programmed and some storage elements 260, 262, 264, and 266 that have not been programmed. As described in more detail below, the distributed program component 150 controls whether portions of a storage device, such as a NAND string 255, are used for memory and/or storage operations.

Figure 3:
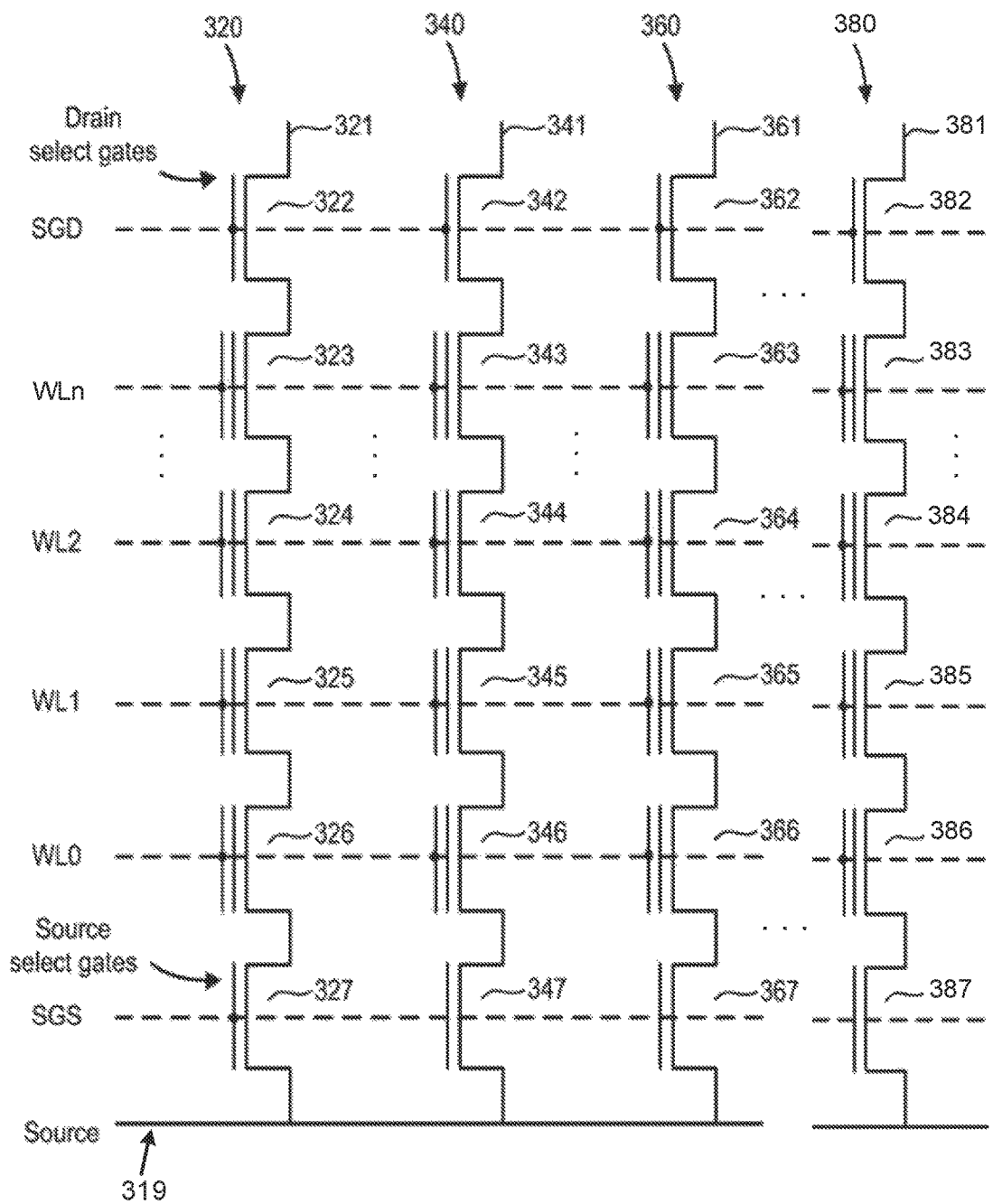
FIG. 3 is a schematic block diagram illustrating one embodiment of an array of storage cells.

FIG. 3 is a circuit diagram depicting a plurality of NAND strings 320, 340, 360, and 380. Each of the NAND strings 320, 340, 360, and 380 may be substantially similar to the NAND string 255, discussed above. The architecture for a flash memory system using a NAND structure may include several NAND strings 320, 340, 360, and 380. For example, FIG. 3 illustrates NAND strings 320, 340, 360, and 380 in a memory array 200 that includes multiple NAND strings 320, 340, 360, and 380.

In the depicted embodiment, each NAND string 320, 340, 360, and 380 includes drain select transistors 322, 342, 362, and 382, source select transistors 327, 347, 367, and 387, and storage elements 323-326, 343-346, 363-366, and 383-386. While four storage elements 323-326, 343-346, 363-366, and 383-386 per NAND string 320, 340, 360, and 380 are illustrated for simplicity, some NAND strings 320, 340, 360, and 380 can include any number of storage elements (e.g., thirty-two, sixty-four, or the like storage elements, among other storage elements that are possible and contemplated herein).

NAND strings 320, 340, 360, and 380, in one embodiment, are connected to a source line 319 by source select transistors 327, 347, 367, and 387. A selection line SGS may be used to control the source side select transistors. The various NAND strings 320, 340, 360, and 380, in one embodiment, are connected to bit lines 321, 341, 361, 381 by drain select transistors 322, 342, 362, and 382. The drain select transistors 322, 342, 362, and 382 may be controlled by a drain select line SGD. In some embodiments, the select lines do not necessarily need to be in common among the NAND strings 320, 340, 360, and 380; that is, different select lines can be provided for different NAND strings 320, 340, 360, and 380.

As described above, each wordline WL0-WLn comprises one or more storage elements 323-383, 324-384, 325-385, and 326-386. In the depicted embodiment, each bit line 321, 341, 361, 381 and the respective NAND string 320, 340, 360, and 380 comprise the columns of the memory array 200, storage block, erase block, or the like. The wordlines WL0-WLn, in some embodiments, comprise the rows of the memory array 200, storage block, erase block, or the like. Each wordline WL0-WLn, in some embodiments, connects the control gates of each storage element 323-383, 324-384, 325-385, and 326-386 in a row. Alternatively, the control gates may be provided by the wordlines WL0-WLn themselves. In some embodiments, a wordline WL0-WLn may include tens, hundreds, thousands, millions, or the like of storage elements 323-383, 324-384, 325-385, and 326-386.

In one embodiment, each storage element 323-326, 343-346, 363-366, and 383-386 is configured to store data. For example, when storing one bit of digital data, the range of possible threshold voltages ("VTH") of each storage element 323-326, 343-346, 363-366, and 383-386 may be divided into two ranges that are assigned logical data "1" and "0." In one example of a NAND type flash memory, the VTH may be negative after the storage elements 323-326, 343-346, 363-366, and 383-386 are erased, and defined as logic "1." In one embodiment, the VTH after a program operation is positive and defined as logic "0." When the VTH is negative and a read is attempted, in some embodiments, storage elements 323-326, 343-346, 363-366, and 383-386 will turn on to indicate logic "1" is being stored. When the VTH is positive and a read operation is attempted, in a further embodiment, a storage element will not turn on, which indicates that logic "0" is stored.

Each storage element 323-383, 324-384, 325-385, and 326-386 may also store multiple levels of information, for example, multiple bits of digital data. In such an embodiment, the range of VTH value is divided into the number of levels of data. For example, if eight levels of information can be stored in each storage element 323-326, 343-346, 363-366, and 383-386, there will be eight VTH ranges assigned to the data values '111', '110', '101', '100', '011', '010', '001', and '000.' Storage elements storing three bits of digital data are referred to herein as triple-level cells ("TLC").

In one example of a NAND type memory, the VTH after an erase operation may be negative and defined as '111.' Positive VTH values may be used for the states of '110', '101', '100', '011', '010', '001', and '000.' In one embodiment, the specific relationship between the data programmed into the storage elements 323-326, 343-346, 363-366, and 383-386 and the threshold voltage ranges of the storage elements 323-326, 343-346, 363-366, and 383-386 depends upon the data encoding scheme adopted for the storage elements 323-326, 343-346, 363-366, and 383-386.

Figure 4:
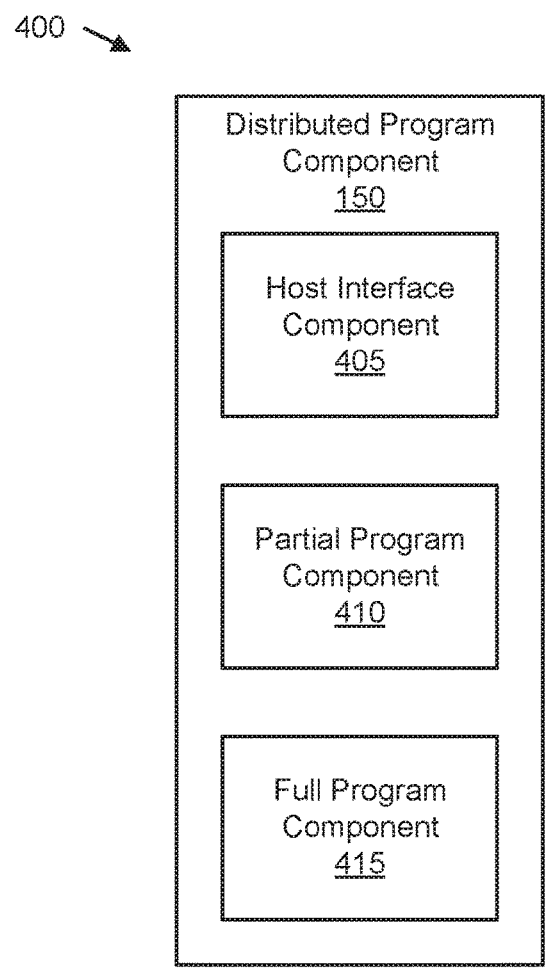
FIG. 4 is a schematic block diagram illustrating one embodiment of a distributed program component for distributed program operation.

FIG. 4 depicts a first apparatus 400 for distributing the program operation over time. The first apparatus 400 includes one embodiment of a distributed program component 150, which may be substantially similar to the distributed program component 150 described above with regard to FIGS. 1A and 1B. In general, as described above, in response to a write command from a host, the distributed program component 150 programs a page, wordline, or other set of memory cells to a partial program state, for example by applying a first number program pulses. This is referred to as the first stage of a distributed program operation. The distributed program component 150 acknowledges the write command, thereby releasing resources so the host can perform one or more additional storage operations on the page/wordline is in the partial program state.

At a later point in time, the distributed program component 150 programs the page/wordline to a fully programmed state, for example by applying a second number program pulses. This is referred to as a second stage of the distributed program operation. In the depicted embodiment, the distributed program component 150 includes a host interface component 405, a partial program component 410, and a full program component 415, which are described in more detail below. The components 405-415, in one embodiment, are communicatively coupled to one another, for example, via a data communication bus.

The host interface component 405, in one embodiment, is configured to receive an instruction to write data to memory, for example receiving a write command from a host. In certain embodiments, the instruction to write data is a write (program operation) command received from a host, the instruction including one or more logical block addresses ("LBAs") and data to be written to the LBA(s). In certain embodiments, the host interface component 405 stores the data to be written into a buffer or cache of the memory device. In one embodiment, the data to be written may be stored in a page buffer or other data latch of the memory device. In another embodiment, the data is stored in volatile memory of the controller, volatile memory of the host device, a dedicated cache for partial programming, or the like.

Moreover, the host interface component 405 is configured to acknowledge the write command after the page/wordline is in a partially programmed state. In certain embodiments, the host interface component 405 indicates, to the host, that a page is in a partially programmed state. In such embodiments, the host interface component 405 will also indicate, to the host, when the page is programmed to a fully programmed state. In one embodiment, a one-bit value is used indicate whether the page is in a partially or fully programmed state.

The partial program component 410, in one embodiment, is configured to program a page, wordline, or other set of memory cells of the memory device to a partial program state in response to the instruction to write data. As used herein, the "partial program state" refers to state where the data read from the page/wordline has a correctable amount of bit errors (e.g., includes a number of errors less than the maximum correctable by an ECC), but where less than the full amount of charge is stored in the memory cell. The partial program component 410 programs the page/wordline to a point where the data is readable from the wordline with a first threshold amount of errors (e.g., a correctable amount of bit errors).

For example, the partial program state may be achieved by applying less than the full number of program pulses and/or by using lower program verify voltages than those used in a non-distributed program operation. Here, the partial program state is a temporary state, where the partially programmed data is readable (with a correctable number of bit errors) for a certain duration, referred to as a "validity period" or "retention time," after which the number of errors may no longer be correctible, for example due to voltage drift.

In certain embodiments, the partial program component 410 programs the page or wordline to the partial program state includes programming the page/wordline with a first number of program pulses or cycles. Here, the number of program pulses is selected to place the page/wordline in the partial program state where data is readable with errors, but not fully programmed. For example, where a non-distributed program operation of a page of TLC cells may take 8 program pulses, the partial program component 410 may program a page using only 5 program pulses during the first stage of the distributed program operation. In one embodiment, the partial program component 410 (or another component) temporarily set the maximum loop count to the number $N_1$ during the first stage of the distributed program operation, the value of $N_1$ selected to program a first subset of memory cells in the page to an expected value.

In certain embodiments, the partial program component 410 programs the page or wordline to the partial program state by using lower program verify voltages. For example, the program verify voltage used for partial programming may be nearer the read voltage threshold than the program verify voltage of a full program state. Here, the expected amount of voltage drift over the validity may not be enough to cause data stored in the page/wordline to be uncorrectable despite the lower program verify voltage. In one embodiment, the partial program component 410 (or another component) temporarily lowers the program verify voltages of the non-volatile memory media 122 during the first stage of the distributed program operation. In certain embodiments, the partial program component 410 programs the page or wordline to the partial program state by programming the page/wordline until a threshold number of cells are at a first set of program verify voltage thresholds.

The full program component 415, in one embodiment, is configured to program a page, wordline, or other set of memory cells of the memory device to a fully programmed state after a predetermined time. As used herein, the "fully programmed state" refers to a state where the full amount of charge is stored, for example, due to the full amount program pulses being applied to the page/wordline, the read values meeting a second (larger) set of program verify voltages (thresholds), the number of bit errors in the read values being less than the threshold amount, and the like. The fully program state is also the end result of a conventional, non-distributed program operation. Programming the page/wordline to the fully programmed state is a second stage of the distributed programming operation.

In some embodiments, the predetermined time is the end of the validity period. For example, the full program component 415 may fully program a partially programmed page/wordline upon expiration of the validity period. The predetermined time period is sufficient for the host to execute one or more storage operations between the first and second stages of the distributed program operation. In certain embodiments, the full program component 415 programs the page/wordline to the fully programmed state using lower program voltages and/or program voltage steps than the partial program component 410 uses to program to the partial program state. The lower voltages and/or voltage steps may be used to minimize disruption to neighboring pages/wordlines.

In some embodiments, the full program component 415 acquires the data for the second stage of the distributed program operation by searching a cache of the non-volatile memory media 122. In one embodiment, the full program component 415 determines whether the data to be written to the page is still in a page buffer or data latch. Where this is the case, the data does not need to be read back from the partially programmed cell, thus reducing the duration of the second stage of the distributed program operation. In another embodiment, the full program component 415 searches a volatile memory of the controller, volatile memory of the host device, or the like for the data to be written to the page. In a third embodiment, the full program component 415 retrieves the data to be written from an internal RAM dedicated to storing partially programmed data. In other embodiments, the full program component 415 acquires the data for the second stage of the distributed program operation by reading and decoding the partially programmed page/wordline within the validity period.

Figure 5:
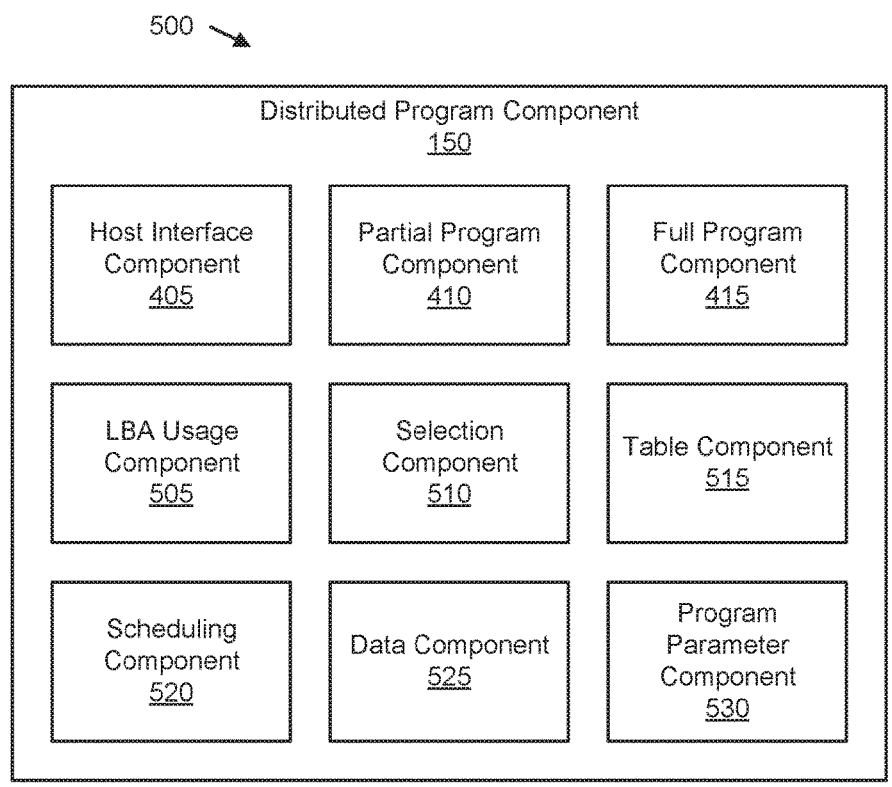
FIG. 5 is a schematic block diagram of one embodiment of a timeline for distributed program operation.

FIG. 5 depicts a second apparatus 500 for distributing the program operation over time, according to embodiments of the disclosure. The second apparatus 500 include another embodiment of a distributed program component 150, which may be substantially similar to the distributed program components 150 described above with regards to FIGS. 1-4. In general, as described above, the distributed program component 150 distributes program operation in time, for example separating the operation into a first stage and a second stage, with the storage resources released to the host after the first stage such that one or more intervening operations may be performed prior to the second stage. In the depicted embodiment, the distributed program component 150 includes a host interface component 405, partial program component 410, and full program component 415, which may be substantially similar to the components 405-415 described above with reference to FIG. 4. The distributed program component 150 further includes one or more of a LBA usage component 505, selection component 510, table component 515, scheduling component 520, data component 525, and program parameter component 530. The components 405-415 and 505-530, in one embodiment, may be communicatively coupled to one another, for example, via a data communication bus.

In various embodiments, the LBA usage component 505 is configured to track a usage frequency for a plurality of LBAs of a memory device (e.g., the non-volatile memory device 120) in a usage table. One example of such a usage table is the LBA usage frequency table 950 discussed below with reference to FIG. 9. Typically, these table includes an LBA identity/value at a frequency count corresponding to the LBA identity/value. In some embodiments, the "usage frequency" is a rate at which data is written to the LBA. In other embodiments, the "usage frequency" is a count indicating the number of times data is written to the LBA. As discussed in further detail below, the selection component 510 may map the LBA to an area of memory based on the usage frequency.

In some embodiments, tracking the usage frequency for the plurality of LBAs includes updating the table whenever a write command is received. For instance, the LBA component 505 may check to see if an LBA in the write command is present in the frequently used LBA table. If the LBA is in the frequently used LBA table 950, then the LBA component 505 may increment a usage count for that LBA. Otherwise, if the LBA is not in the frequently used LBA table 950, then the LBA component 505 may create a new entry. In one embodiment, the LBA usage component 505 drops a predetermined number of least-used entries after predetermined interval.

Moreover, in response to the host interface component 405 receiving a write command, the LBA usage component 505 may identify a usage frequency of the LBA included in the write command. Here, the LBA usage component 505 receives the first LBA which corresponds to an LBA in a write command received from the host. For example, the host interface component 405 may communicate the first LBA to the LBA usage component 505. Tracking the usage frequency for the LBAs of the memory device is discussed in further detail below, with reference to FIG. 8.

In various embodiments, the selection component 510 maps different areas of the memory device to different groups of LBAs, the LBAs being grouped according to usage frequency. Further, in response to the host interface component 405 receiving a write command, the selection component 510 may select an area of the memory device for writing the data based on a usage frequency LBA in the write command. Here, the different areas of the memory device correspond to different storage types. For example, a first area may contain triple-level cells ("TLC"), a second area may contain single-level cells ("SLC"), and a third area may contain cells for distributed program operation. In response to selecting the third area, the partial program component 410 programs a page/wordline in the third area to a partial program state.

In one embodiment, the selection component 510 is configured to maintain a mapping, list, data store, table, record, and/or the like of LBAs to physical storage cells. In certain embodiments, the selection component 510 may maintain the mapping in a flash translation layer (FTL) of the non-volatile memory device 120. As used herein, the FTL may be a component of the non-volatile memory media controller 126 which maps logical block addresses (LBAs) from the host to physical block addresses (PBAs) on the non-volatile memory device 120.

Moreover, the selection component 510 may group the LBAs by comparing a usage frequency of each LBA to one or more selection thresholds. For example, if the usage frequency of an LBA is below the first threshold, then it is grouped with LBAs corresponding to an area of the memory device containing triple-level cells ("TLC"). As another example, if the usage frequency of an LBA is between the first threshold and a second threshold greater than the first threshold, then it is grouped with LBAs corresponding to an area of the memory device containing single-level cells ("SLC"). Note that data is often stored to the SLC area for fast program performance and later transferred to the TLC area. Recall that SLC media take fewer pulses to program than TLC media, but requires more storage cells to store the same amount of data.

As a third example, if the usage frequency of an LBA is above the second threshold, then it is grouped with LBAs corresponding to an area containing cells for distributed program operation (e.g., a partial program area of the memory device). In various embodiments, this third area is referred to as a Low Program Loop Count ("Low LPC") area, as the first stage of the distributed programming operation uses fewer program loops (pulses) to program the data as compared to a conventional program operation of TLC media.

In various embodiments, these thresholds are dynamic and are adjusted based on LBA usage history. For example, the thresholds may be adjusted to maintain a certain level of performance, to balance the amount of data in each storage type, capacity (e.g., total or remaining capacities) of each storage type, and the like. Here, the selection component 510 may adjust one or more of the selection threshold in order to achieve the above goals. Note that the thresholds are used to predict (e.g., from historical performance) which LBAs are most commonly used. This way, the best program performance may be reserved for the most frequently used LBAs. Further, if an LBA mapped to a low PLC area is written to again before expiration of the validity period for the partially programmed page, then there is no need to fully program that page. This may be the case where the OS, driver, or the like writes temporary data to the same LBA. Beneficially, this saves time and uses less power.

Accordingly, the selection component 510 may select an area of the memory device for programming the data based, selecting an area of the memory device may include identifying a group to which the LBA in the write command belongs. In certain embodiments, the selection component 510 selects the area based on LBA usage frequency only after a threshold amount of usage data is collected. For example, the table of LBA usage frequency may poorly predict future LBA usage until the threshold amount of data is collected. Here, collecting usage data includes identifying an LBA being programmed to and tracking the number of times the LBA is programmed (e.g., over a window of time). Mapping the LBAs to specific areas of the memory device is discussed in further detail below, with reference to FIG. 8.

In various embodiments, the table component 515 stores (and optionally maintains) one or more tables used for distributed program operation. In some embodiments, the table component 515 stores one or more partial program tables used identify pages, wordlines, or other sets of memory cells that are in a partial program state. Examples of partial program tables include the first partial program table 900 and the second partial program table 920, discussed below with reference to FIG. 9.

In various embodiments, the partial program table includes an indication of the page, wordline, or other set of memory cells that is in the partial program state. Each entry in the partial program table may also include a time tag which indicates the remaining time in a validity period. As discussed above, the validity period refers to a duration for which the partially program data remains valid (e.g., a time for programming the page, wordline, or other set of memory cells to the fully programmed state). In some embodiments, the table component 515 maintains a partial program table by updating the time tags with the passage of time. As such, the time tags may function as a timer counting down to the end of the validity period. Accordingly, the table component 515 may maintain a record of which (e.g., TLC) storage cells are in a partial program state.

Moreover, the table component 515 may add an entry to the partial program table each time a page, wordline, or other set of memory cells is partially programmed and may further remove an entry from the partial program table when the corresponding page, wordline, or other set of memory cells is fully programmed. The table component 515 may populate the time tag based on a variety of factors including an age of the non-volatile memory media 122, a temperature of the non-volatile memory device 120, a number of program pulses used to partially program the one or more pages of the wordline or other set of non-volatile memory cells, and the like. Recall that the validity period is a maximum time the distributed program component 150 can wait before either fully programming the data or refreshing the partial program state. The validity period may be equal to an expected data retention time or may be a portion of the expected data retention time.

In certain embodiments, the table component 515 stores one or more LBA usage frequency tables. In one embodiment, the table component 515 updates the LBA usage frequency table to increment LBAs included in recommends and periodically dropping least use LBAs from the table. In certain embodiments, the table component 515 maintains the LBA usage frequency table based on instructions received from the table component 515. Accordingly, the table component 515 may maintain a record of which LBAs correspond to an area of the memory device where distributed program operation is performed.

In various embodiments, the scheduling component 520 is configured to schedule a partially programmed page (or wordline or other set of memory cells) for programming to a fully programmed state. Optionally, the scheduling component 520 may schedule a partially programmed page for additional programming to "refresh" the partial program state. In some embodiments, the scheduling component 520 searches a partial program table for an expiring entry (e.g., an entry whose time tag is less than the threshold amount). In response to finding an expiring entry, the scheduling component 520 schedules the entry for additional programming, e.g., by the full program component 415. In certain embodiments, the scheduling component 520 may schedule a page for additional programming prior to expiration of the validity period, for example due to the channel being idle. As such, the distributed programming operation may be used as a load-balancing tool to defer fully programming a page until load conditions improve.

In various embodiments, the data component 525 is configured to acquire data for a second stage of the distributed program operation (e.g., for fully programming a page in the partial program state). In certain embodiments, the data component 525 searches a cache of the memory device (e.g., a page buffer or other data latch) for data corresponding to the partially programmed page (or wordline or other set of memory cells). In certain embodiments, the data component 525 decodes (e.g., using an error correction code) values read from the partially programmed page in order to acquire the data for the second stage of the distributed program operation. In various embodiments, the data component 525 searches the cache of the memory device for the data, and reads/decodes data from the partially programmed page if the data stored in the cache is missing (e.g., overwritten). Notably, acquiring data from the cache saves time by avoiding a read and decode operation.

In various embodiments, the program parameter component 530 is configured to adjust various parameters used in the distributed program operation. Examples of such parameters include, but are not limited to, a maximum loop count (e.g., program pulse/cycle), a program verify voltage, a number of program pulses before a verify step, a number of bit errors correctable by the error correction code, and the like.

In one embodiment, the program parameter component 530 stores a first program verify voltage to be used in a first stage of the distributed program operation. Here, the first program verify voltage may be a lower value than a second program verify voltage used when fully programming the same memory cell (e.g., in a second stage of the distributed program operation. In one embodiment, the second program verify voltage is the same as a program verify voltage used for a non-distributed program operation. In certain embodiments, the first program verify voltage is selected they start a number of errors correctable when decoding a page using an error correction code ("ECC"). For example, the program parameter component 530 may empirically derive the first program verify voltage based on the number of errors correctable when decoding a page using the ECC.

Moreover, in certain embodiments, the program parameter component 530 may set and/or adjust the program verify voltage parameter of the non-volatile memory media 122 to the first program verify voltage as a preliminary step of the first stage of the distributed program operation. Further, after completing the first stage of the distributed program operation, the program parameter component 530 may set and/or adjust the program verify voltage parameter to the second program verify voltage (or revert to a default program verify voltage). Alternatively, the program parameter component 530 may set and/or adjust the program verify voltage parameter of the non-volatile memory media 122 to the second program verify voltage as a preliminary step of the second stage of the distributed program operation. While depicted as a separate component, in certain embodiments the program parameter component 530 is a subcomponent of the partial program component 410 and/or the full program component 415. Moreover, the value of the program verify voltage may be based on a logical page programmed to the memory cell. As such, for MLC and TLC areas of the non-volatile memory device 120, the first program verify voltage may be a first set of program verify voltages and the second program verify voltage may be a second set of program verify voltages.

In one embodiment, the program parameter component 530 stores a first number of program pulses/cycles, such as a first maximum loop count N1, to be used in the first stage of the distributed program operation. Here, the value of N1 may be selected to program a first subset of memory cells in the page/wordline to an expected value. As such, the number of bit errors in the page/wordline will be a level correctable using the ECC. Moreover, the program parameter component 530 may store a second number of program pulses/cycles, such as the second maximum loop count $N_2$, to be used in the second stage of the distributed program operation. Again, the value of $N_2$ may be selected to program a second subset of memory cells in the page/wordline to an expected value, the second subset larger than the first.

In one embodiment, the program parameter component 530 stores a number of bit errors in a page, E, that can be corrected using an error correction code. Moreover, when implemented at a controller-level the program parameter component 530 may communicate the number of bit errors correctable using the ECC, E, to a memory die 212. Here, the program parameter component 530 may pass this number/parameter to a minimum loop count program component 155 implemented on a memory die. Alternatively, when implemented at the die-level, the program parameter component 530 may receive E, the number of bit errors correctable using the ECC, from a media controller.

In certain embodiments the program parameter component 530 is configured to decode values read from the page/wordline (e.g., after first number of voltage pulses in the first stage of the distributed program operation) to identify a number of bit errors in the read values, and determine whether the number of bit errors in the read values is less than a first threshold amount (e.g., the number of bit errors that can be corrected using the ECC). Similarly, the program parameter component 530 may be configured to decode values read from the page/wordline during the second stage of the distributed program operation and identify the number of bit errors in the read values in order to determine whether the data is fully programmed (e.g., indicated by the number of errors being less than a second threshold).

Figure 6:
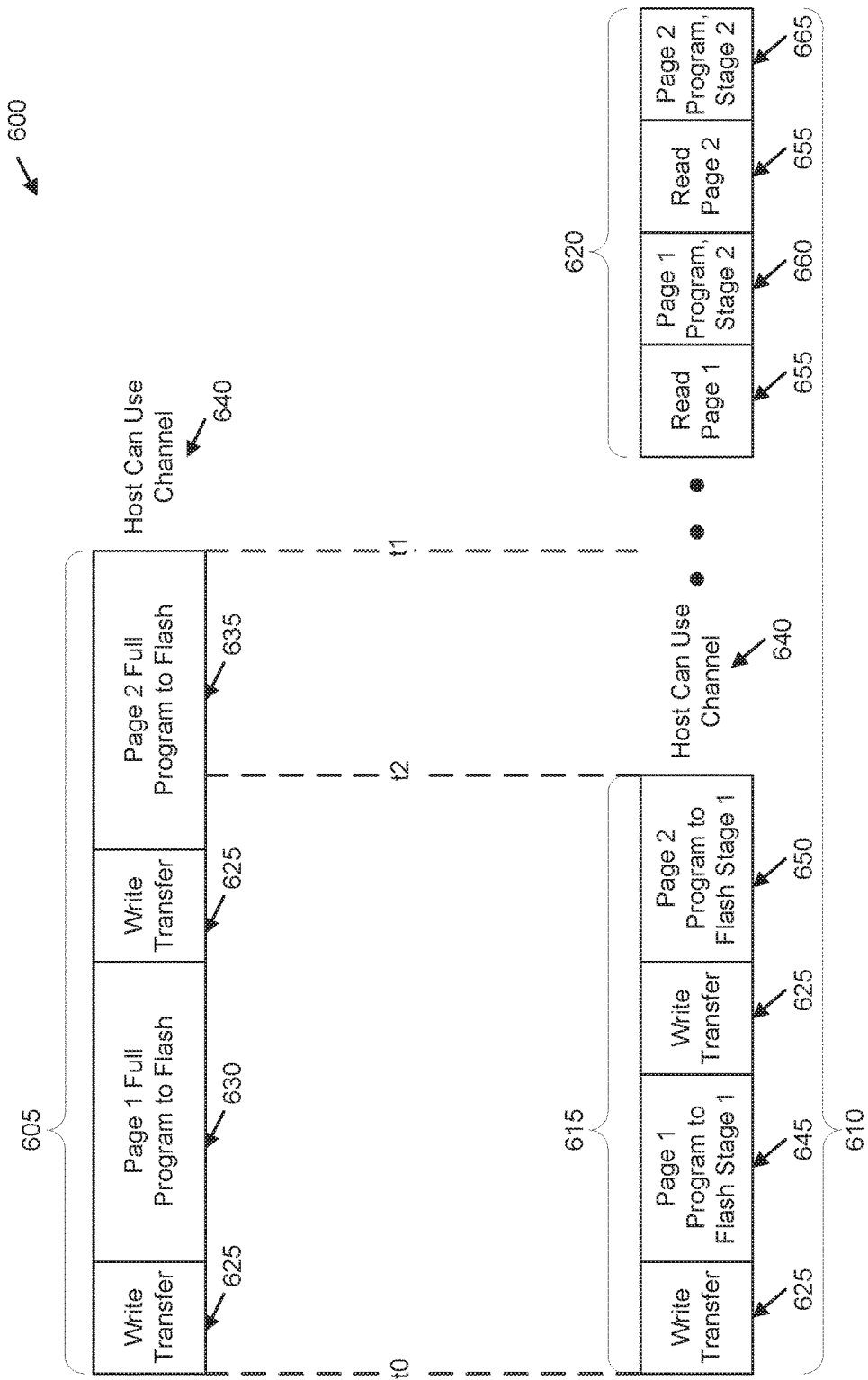
FIG. 6 is a block diagram illustrating one embodiment of a timeline for a distributed program operation.

FIG. 6 depicts a timeline 600 of a distributed program operation, according to embodiments of the disclosure. The timeline 600 illustrates the timing differences between a non-distributed program operation 605 and the distributed program operation 610. In the depicted embodiment, the distributed program operation 610 includes a first stage 615 and the second stage 620. The timeline 600 begins at time to when an instruction to program data is received, e.g., by the host issuing a write command. In one embodiment, the data includes a first page and a second page, for example, for programming to a wordline of MLC memory cells.

The non-distributed program operation 605 begins with a write transfer step 625. Here, data for writing to the first logical page is loaded. For example, data received from the host and stored at an ASIC at the flash management level may be transferred to a die-level buffer, such as a transfer data latch (XDL) or other data latch (ADL, BDL, CDL, DDL, or the like), during this step. After the write transfer step 625, the non-distributed program operation 605 includes a first full program step 630, where the first logical page is fully programmed to the flash memory. The non-distributed program operation 605 continues with another write transfer step 625 where data for the second logical page is loaded. Then, the non-distributed program operation 605 concludes with a second full program step 635, with the second logical page is fully programmed to flash memory.

As discussed above, "fully programming" each logical page comprises applying the full amount of program pulses and comparing the stored charge to the second set of program verify voltages. Note that the non-distributed program operation 605 ends at time $t_1$. At this point, the channel is again available 640 for the host to use. In certain embodiments, the distributed program component 150 and/or host interface component 405 indicates to the host of the write command has completed (e.g., acknowledges the write command).

The distributed program operation 610 also begins with a write transfer step 625, or data for writing to the first logical page is loaded. After the write transfer step 625, the distributed program operation 610 includes a first partial program step 645 were the first logical page is partially programmed to the flash memory. Next, another write transfer step 625 occurs, where data for the second logical page is loaded. Then, the distributed program operation 610 includes a second partial program step 650, where the second logical page is partially programmed to the flash memory. This concludes the first stage 615 of the distributed program operation 610

As discussed above, "partially programming" each logical page comprises applying a sufficient amount of program pulses to store sufficient charge such that data reads from the page with a correctable number of bit errors. Note that the distributed program operation 610 ends at time t2. At this point, the channels again available 640 for the host to use. In certain embodiments, the distributed program component 150 and/or host interface component 405 indicates to the host of the write command has completed (e.g., acknowledges the write command). Because each partial program step 645, 650 has a shorter duration than a corresponding four program steps 630, 635, the first stage 615 ends before the non-distributed program operation 605 and the host is able to use the channel sooner.

In one embodiment, partial programming is achieved by applying a reduced number of program pulses. In another embodiment, partial programming is achieved by verifying at a first set of program verify voltages that are lower than the second set of program verify voltages. In the third embodiment, partial programming may be achieved by applying program pulses and reading data until the data reads from the page with a correctable number of bit errors.

At a later point in time, the distributed program operation 610 concludes with the second stage 620. The second stage 620 begins with a read step 655 where data for the first logical page is loaded, either by acquiring data from the memory cache (e.g., page buffer or internal RAM) or by reading/decoding values already stored to the first logical page. Then, the second stage 620 includes a third programming step 660, where the first logical page is fully programmed. Next, another read step 655 occurs, where data for the second logical page is loaded (either by acquiring data from the memory cache or by reading/decoding values already stored to the second logical page). Finally, the second stage 620 includes a fourth programming step 665, where the second logical page is fully programmed.

Figure 7:
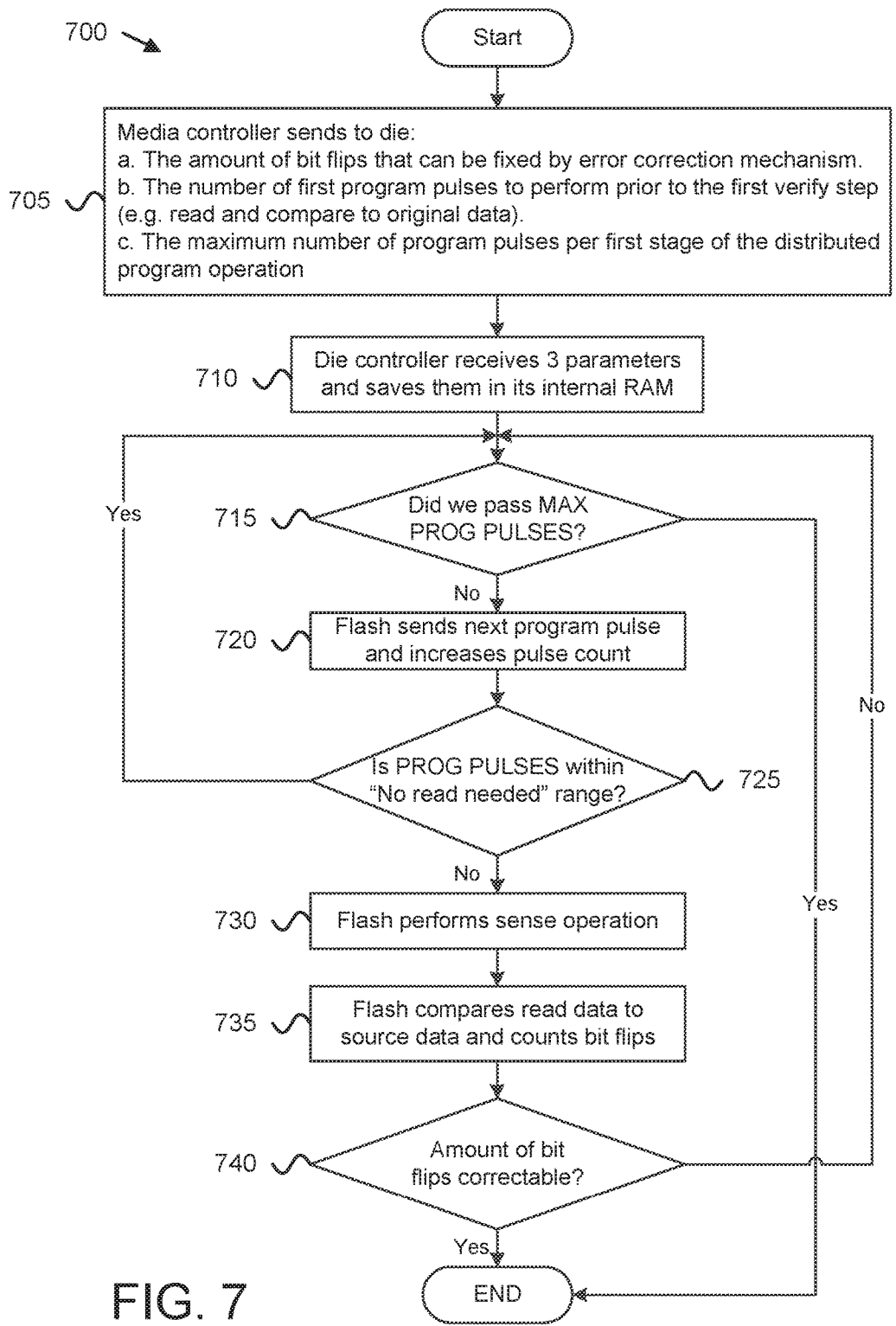
FIG. 7 is a flowchart diagram illustrating one embodiment of a die-level procedure for distributed program operation.

FIG. 7 is a flowchart depicting one procedure 700 for die-level implementation of a distributed program operation, according to embodiments of the disclosure. In one embodiment, the procedure 700 performed by the die controller 220, specifically a minimum loop count program component 155 within the die controller 220. The procedure 700 begins, and a media controller sends three parameters to the die (see step 705). Here, the media controller sends: a) an amount of bit flips (e.g., bit errors) that can be fixed by an error correction mechanism (e.g., decoding using an error correction code), b) the number first program pulses to perform prior to the first verification step (e.g., read/decoding stored values and comparing to original data), and c) the maximum number of program pulses in the first stage of the distributed program operation (e.g., $N_1$).

Note that for flash media, a program operation is a multi-phase operation in which the storage element applies, in "pulses," successively increasing amounts of voltage to storage cells to cause the stored charge in the cell to increase. To verify, the storage element reads the value of the cell to determine if the voltage for the cell is within a certain range indicative of having programmed the cell (e.g., either to a partially programmed voltage or a fully programmed voltage, depending on the stage of the distributed program operation). If the read voltage is in range, the storage element stops the programming operation, and returns to a ready state in which a new operation can be performed. If not, the storage element applies another amount of voltage and re-reads the cell to determine if the voltage for the cell is within a certain range indicative of having programmed the cell. This process repeats until a cell of a storage element is programmed (or Intel the maximum number of program pulses is reached).

At step 710, the die controller 220 receives the three parameters and saves them to internal RAM. Next, at step 715, the die controller 220 determines whether the program operation has reached the maximum number of program pulses (e.g., $N_1$). If the maximum number of program pulses is reached, the procedure 700 ends. In some embodiments, the die controller 220 indicates an error condition in response to reaching the maximum number of pulses without the cell voltage being in the range. Otherwise, the die controller 220 sends the next program pulse and increases the pulse count (see step 720).

Next, at step 725, the die controller 220 determines whether the number of program pulses is within a "no read needed" range, as indicated by the number of first program pulses to perform prior to the first verify step. If the number of pulses is within the "no read needed" range, then the procedure 700 returns to determining whether the maximum number of program pulses is reached. Otherwise, the die controller 220 performs a sense operation, where voltage values are read from the program cells (see step 730). Moreover, the die controller 220 decodes the read values (e.g., to produce data).

At step 735, the die controller 220 compares the read data to the source data and counts the number of bit flips (e.g., bit errors). At 740, die controller 220 then determines whether the amount of bit flips is correctable (e.g., using the parameter stored in RAM). If the amount of bit flips is correctable, then the procedure 700 ends. Otherwise, if the amount of bit flips is not correctable, then the procedure 700 returns to determining whether the maximum number of program pulses is reached.

Figure 8:
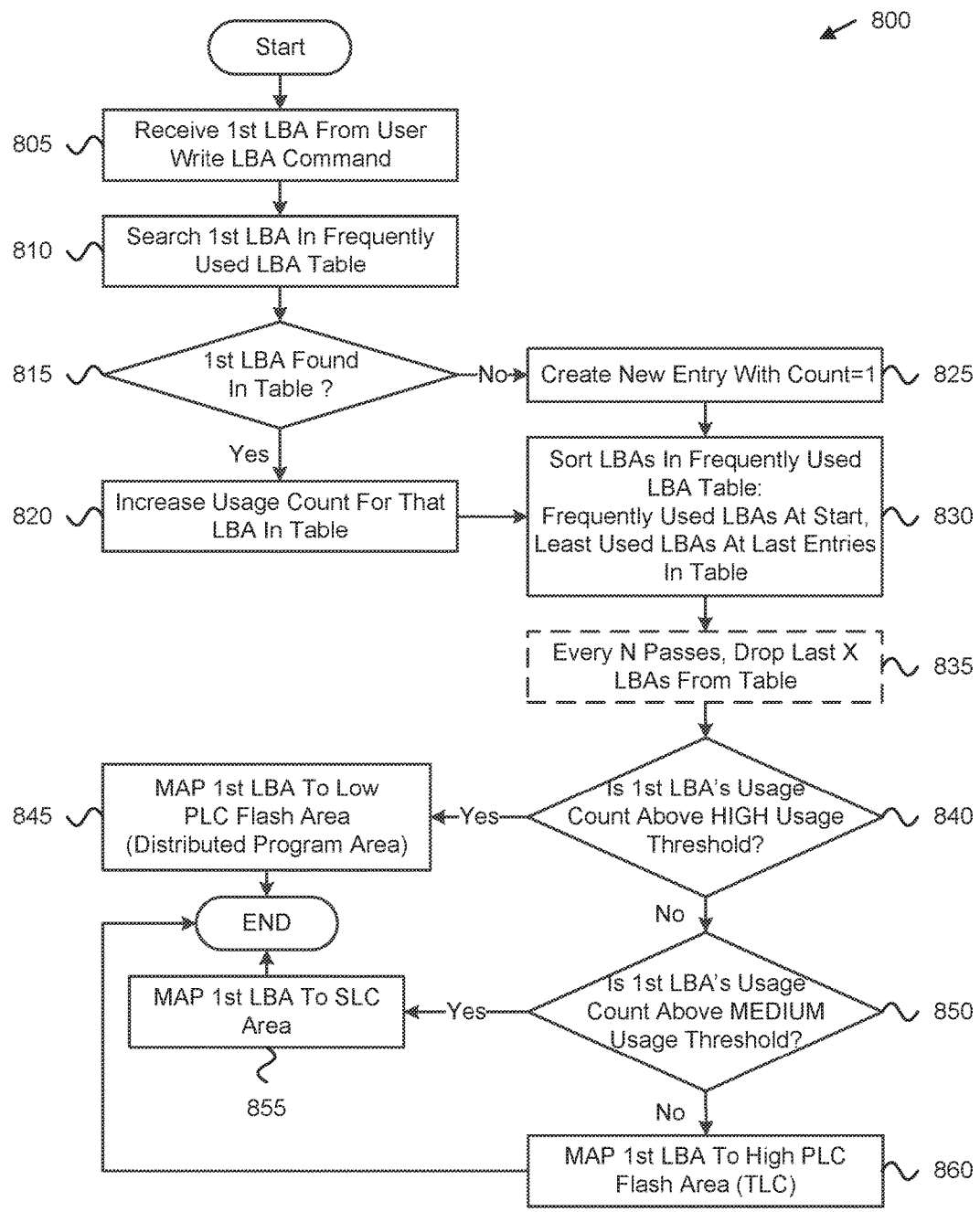
FIG. 8 is a flowchart diagram illustrating one embodiment of a procedure for mapping a LBA to a suitable flash area based on LBA usage frequency.

FIG. 8 depicts one procedure 800 for mapping a LBA to a suitable flash area based on LBA usage frequency, according to embodiments of the disclosure. The procedure 800 may be implemented by the distributed program component 150 and/or by the non-volatile memory media controller 126. Due to certain OS (or driver) files, setting, and the like, certain data is always stored in the same LBA. As discussed above, the non-volatile memory media controller 126 may cause incoming data to be initially written to an SLC area (for improved write performance) and later transferred to TLC (for improved storage density). However, this approach may needlessly relocate data belonging to an LBA that is to be rewritten soon. For such situations, relocating data wastes power and time and adds unnecessary wear to the memory media.

Accordingly, the procedure 800 may be used to identify an optimal flash storage type (e.g., SLC, TLC, or low PLC). The procedure 800 begins with receiving a first LBA, e.g., from a write LBA command received from the user (e.g., from host 110, see step 805). The distributed program component 150 then searches for the first LBA in a table of frequently used LBAs, such as the LBA usage frequency table 950 discussed below (see step 810). Accordingly, the distributed program component 150 determines whether the first LBA is found in the table (see decision 815).

In response to the first LBA being found in the table, the distributed program component 150 increases the usage count for that LBA (e.g., updates the table of frequently used LBAs, see step 820). Otherwise, if the first LBA is not in the table, the distributed program component 150 creates a new entry in the table of frequently used LBAs with an initial usage count value of one (see step 825).

Next, the distributed program component 150 sorts the LBAs in the table of frequently used LBAs, arranging the most frequently used LBAs at the start of the table and the least frequently used LBAs at the end of the table (occupying the last entries, see step 830). Every N passes, the distributed program component 150 drops (removes) a certain number (represented as 'X') of last entries from the table (see step 835). This removes the least used LBAs and keeps the table size from becoming unmanageable.

The procedure 800 includes the distributed program component 150 determining whether the first LBA's usage count is above a first threshold corresponding to high LBA usage (e.g., a 'high usage' threshold, see decision 840). If the first LBA's usage count is above the first threshold, then the distributed program component 150 maps the first LBA to a low program loop count ("low PLC") area of the memory device where distributed programming occurs (e.g., a "distributed program area" of the flash memory, see step 845). Otherwise, the distributed program component 150 determines whether the first LBA's usage count is above a second threshold corresponding to medium LBA usage (e.g., a 'medium usage' threshold, see decision 850). If the first LBA's usage count is above the first threshold, then the distributed program component 150 maps the first LBA to a single level cell ("SLC") area of the memory device (see step 855). Otherwise, the distributed program component 150 maps the first LBA to a triple level cell ("TLC") area of the memory device where non-distributed programming occurs (see step 860). The procedure 800 ends.

The steps 805-835 are data collection steps and may gather historical data to be used to predict future usage of LBAs. In certain embodiments, the steps 840-860 are not implemented until sufficient data is gathered. Once a threshold amount of data has been collected, then the distributed program component 150 can intelligently map LBAs to storage areas (e.g., storage types) based on usage, with historical usage being used to predict the likelihood that an LBA will be written to again in the near future. Accordingly, the distributed program component 150 and/or the non-volatile memory media controller 126 may use conventional mapping/allocation techniques to select a PBA until sufficient data is collected (e.g., write to SLC, then copyback to TLC).

As discussed above, the high usage threshold and medium usage threshold may be dynamically selected. For example, the thresholds may be adjusted to maintain a desired level of program performance, by the desired amount of data to be stored in each area, by storage capacities of the areas, and the like. In various embodiments, the procedure 800 is implemented at the non-volatile memory media controller 126 level, at a host-interface module level, at the device driver level, or the like.

FIG. 9 depicts a plurality of tables used for a distributed program operation, according to embodiments of the disclosure. FIG. 9 depicts a first partial program table 900 and a second partial program table 920. The first partial program table 900 is ordered according to page identifier, while the second partial program table 920 is ordered according to time remaining.

The first partial program table 900 includes one or more entries. Each entry includes an identifier 905 and a time tag 910. The second partial program table 920 also includes one or more entries, each having an identifier 905 and a time tag 910. The identifier 905 indicates a location of the unit of memory that is in a partial programmed state. In the depicted embodiment, the identifier 905 specifies a page (e.g., a physical page) of the memory device; however, other embodiments may indicate a wordline, a (e.g., physical) block address, or the like.

The time tag 910 indicates a time remaining in the validity period (e.g., the time that is left for each page to be fully programmed or "refreshed"). In the depicted embodiment, the time remaining is measured in seconds; however, other embodiments may measure the time remaining in different units. Moreover, the distributed program component 150 (or subcomponent thereof) periodically updates the time tag, for example counting down the time remaining in the validity period. When an entry reaches a threshold amount of time remaining, it will be chosen for programming the second stage of the distributed programming operation. In one embodiment, the threshold amount of time remaining is zero.

When a new page (or other unit of memory) is partially programmed to flash, it will be added to a partial program table, such as the first partial program table 900 or the second partial program table 920. When that page is later fully programmed, the corresponding entry is removed from the partial program table. If the data stored in a partially programmed page is refreshed without being fully programming, the time tag 910 in the corresponding entry is updated (e.g., reset).

FIG. 9 depicts a LBA usage frequency table 950 which correlates LBAs 955 to a write access count 960 (also referred to as "usage count"). In the depicted embodiment, the LBA usage frequency table 950 is ordered according to the usage count. For example, the LBA usage frequency table 950 may be ordered such that frequently used LBAs area placed at a beginning of the table, and the least used LBAs are the last entries in table. In other embodiments, the LBA usage frequency table 950 may be ordered according to LBA value.

When a write command is received, the distributed program component 150 (or a subcomponent thereof) searches the LBA usage frequency table 950 for the LBA number in the write command. If found, the usage count for that LBA in incremented. If not found, the distributed program component 150 creates new entry in table corresponding to the LBA number in the write command, with usage count=1. Periodically, (e.g., every N passes) a number of least used LBAs are dropped (e.g., removed) from the LBA usage frequency table 950. As discussed herein, the LBA usage frequency table 950 may be used to map LBAs to a suitable Flash Storage area according to the frequency of their usage.

Figure 10:
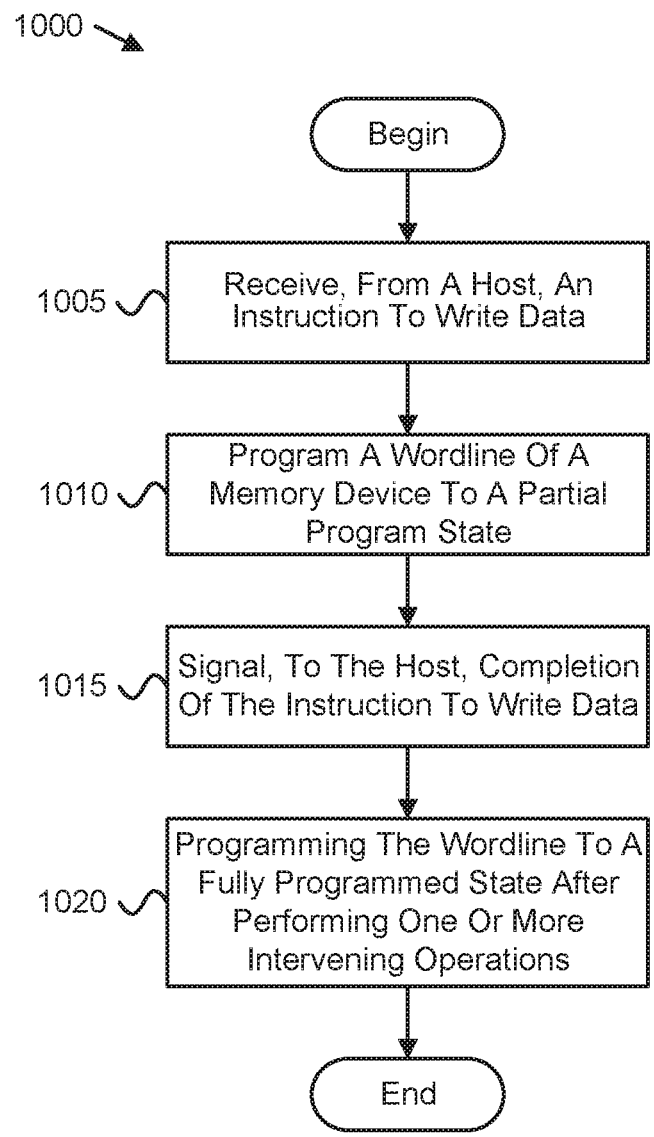
FIG. 10 is a schematic flowchart diagram illustrating one embodiment of a method for distributed program operation.

FIG. 10 is a schematic flowchart diagram illustrating a method 1000 for distributed program operation, according to embodiments of the disclosure. In one embodiment, the method 1000 begins and the host interface component 405 receives 1005, from a host, an instruction to write data. In certain embodiments, the instruction to write data is a program operation command that includes data to be written to a non-volatile memory media 122 and one or more logical block addresses ("LBAs") for the data. In one embodiment, the address is associated with a set of TLC memory cells (e.g., a wordline, a physical page, and/or a portion thereof).

Means for receiving an instruction to write data, in various embodiments, may include, in various embodiments, one or more of a distributed program component 150, a host interface component 405, a controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for receiving an instruction to write data.

The method 1000 includes a partial program component 410 programming 1010 a set of non-volatile memory cells of a memory device to a partial program state in response to the instruction to program data. Means for programming a set of non-volatile memory cells of a memory device to a partial program state, in various embodiments, may include, in various embodiments, one or more of a distributed program component 150, a partial program component 410, a controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for programming a set of non-volatile memory cells of a memory device to a partial program state.

In certain embodiments, method 1000 includes the host interface component 405 signaling 1015, to the host, the completion of the instruction to write data, in response to programming the set of non-volatile memory cells to a partial program state. In certain embodiments, signaling 1015 the completion of the instruction to write data includes the host interface component 405 setting a bit status in a bitmap to indicate that an LBA corresponding to the write command is successfully programmed. In one embodiment, signaling 1015 the completion of the instruction to write data also includes indicating that the corresponding LBA is in a partially programmed state.

Means for signaling the completion of the instruction to write data, in various embodiments, may include, in various embodiments, one or more of a distributed program component 150, a host interface component 405, a controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for signaling the completion of the instruction to write data to the host.

The method 1000 may further include the full program component 415 programming 1020 the set of non-volatile memory cells to a fully programmed state after performing one or more intervening operations (e.g., storage operations). The method 1000 ends. Here, the full program component 415 may wait a predetermined time period before programming 1020 the set of non-volatile memory cells to the fully programmed state, wherein one or more storage operations (e.g., such as a read operation and/or a program operation) are performed during the time period. In various embodiments, the full program component 415 waits a maximum time before programming 1020 the set of non-volatile memory cells to the fully programmed state, the maximum time being based on an age of the non-volatile memory media 122, a temperature of the non-volatile memory device 120, a number of program pulses used to partially program the set of non-volatile memory cells, and the like.

In one embodiment, programming 1020 the set of non-volatile memory cells to a fully programmed state includes programming with lower program voltages and/or voltage steps than used when programming the page to a partially programmed state. In certain embodiments, programming 1020 the set of non-volatile memory cells to a fully programmed state includes reading data from the set of non-volatile memory cells prior to fully programming the set of non-volatile memory cells and using the read data as the data source when fully programming the set of non-volatile memory cells (e.g., with or without error correction of the data read from the partially programmed set of non-volatile memory cells, or the like).

Means for programming the set of non-volatile memory cells to a fully programmed state, in various embodiments, may include, in various embodiments, one or more of a distributed program component 150, a full program component 415, a controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for programming the set of non-volatile memory cells to a fully programmed state.

In certain embodiments, programming the set of non-volatile memory cells to a partial program state includes programming the set of non-volatile memory cells to a point where the data is readable with a first threshold amount of errors. In such embodiments, programming the set of non-volatile memory cells to a fully programmed state includes programming the set of non-volatile memory cells to a point where the data is readable with a second threshold amount of errors, the second threshold being smaller than the first threshold. Here, programming the set of non-volatile memory cells to a point where the data is readable with a first threshold amount of errors includes decoding, using an error correction code, values read from the set of non-volatile memory cells after programming a first plurality of voltage pulses, and determining whether an amount of errors in the read values meets the first threshold amount of errors.

In certain embodiments, programming the set of non-volatile memory cells to a partial program state includes programming the set of non-volatile memory cells with a first number of program cycles. Here, the first number is selected to program a first subset of memory cells in the set of non-volatile memory cells to an expected value. In such embodiments, programming the set of non-volatile memory cells to a fully programmed state includes programming the set of non-volatile memory cells with a second number of program cycles, the second number selected to program a second subset of memory cells in the set of non-volatile memory cells to the expected value. Here, the second subset may be larger than the first subset, for example.

In certain embodiments, programming the set of non-volatile memory cells to a partial program state includes programming the set of non-volatile memory cells until a threshold number of cells are at a first set of program verify voltage thresholds. In such embodiments, programming the set of non-volatile memory cells to a fully programmed state includes programming the set of non-volatile memory cells until a second set of program verify voltage thresholds are met, the second set larger than the first. Here, the second set of program verify voltage thresholds may be equal to the program verify voltage thresholds used in a conventional program operation, or the like.

Figure 11:
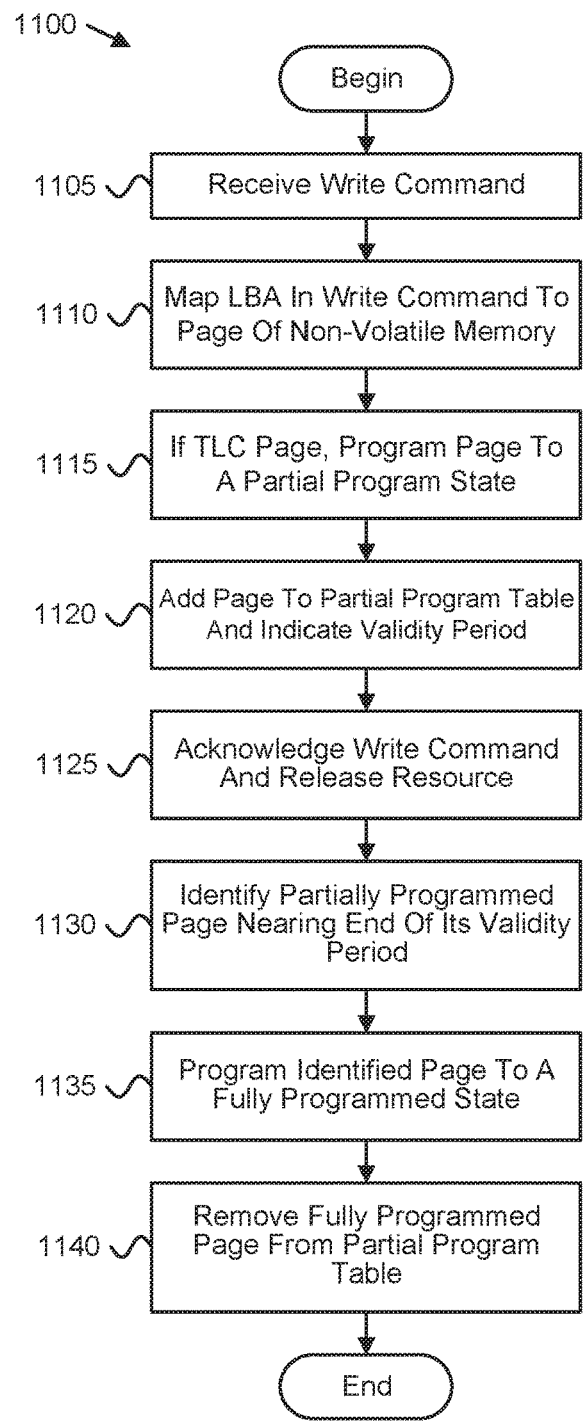
FIG. 11 is a schematic flowchart diagram illustrating a further embodiment of a method for distributed program operation.

FIG. 11 is a schematic flowchart diagram illustrating a method 1100 for distributed program operation, according to embodiments of the disclosure. In one embodiment, the method 1100 begins and the host interface component 405 receives 1105, from a host, an instruction to write data. In certain embodiments, the instruction to write data is a program operation command that includes data to be written to a non-volatile memory media 122 and a logical block address ("LBA") for the data. In one embodiment, the LBA is associated with a set of TLC memory cells (e.g., physical page or wordline).

The method 1100 includes the LBA usage component 505 mapping 1110 an address in the write command to a page of non-volatile memory. In one embodiment, the selection component 510 determines a usage frequency of the address, wherein the LBA usage component 505 maps 1110 the address to an area of the memory device based on the usage frequency. For example, if the selection component 510 determines the usage frequency to be above a high-usage threshold, then the LBA usage component 505 may map the address to a distributed program area of the memory device. As another example, if the selection component 510 determines the usage frequency to be below the high-usage threshold and above a medium-usage threshold, then the LBA usage component 505 maps the address to a SLC area of the memory device. As a third example, if the selection component 510 determines the usage frequency to be below both the high-usage threshold and the medium-usage threshold, then the LBA usage component 505 maps the address to a TLC area of the memory device.

Means for mapping an address in the write command to a page of non-volatile memory, in various embodiments, may include one or more of a distributed program component 150, a LBA usage component 505, a controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for mapping an address in the write command to a page of non-volatile memory. Means for determining a usage frequency of the address, may include, in various embodiments, one or more of a distributed program component 150, a selection component 510, a controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for determining a usage frequency of the address.

The method 1100 includes the partial program component 410 programming 1115 a page of a memory device to a partial program state in response to an address corresponding to a TLC page of non-volatile memory. Means for programming a page to a partial program state, in various embodiments, may include one or more of a distributed program component 150, a partial program component 410, a controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for programming a page to a partial program state.

The method 1100 includes the table component 515 adding 1120 the page in a partial programmed state to a partial program table and indicating a validity period for the page. Examples of partial program tables are discussed above with reference to FIG. 9. In various embodiments, the validity period is based on an age of the non-volatile memory media 122, a temperature of the non-volatile memory device 120, a number of program pulses used to partially program the page, and the like.

Means for adding the page in a partial programmed state to a partial program table and indicating a validity period for the page, may include, in various embodiments, one or more of a distributed program component 150, a table component 515, a controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for adding the page in a partial programmed state to a partial program table and indicating a validity period for the page.

The method 1100 includes the host interface component 405 acknowledging 1125 the write command (e.g., to the host) and releasing resources. In certain embodiments, acknowledging the write command includes the host interface component 405 setting a bit status in a bitmap to indicate that an address corresponding to the write command is successfully programmed. In one embodiment, releasing resources includes indicating to the host that the channel is available for a next storage operation (e.g., a read operation).

Means for acknowledging the write command and releasing resources may include, in various embodiments, one or more of a distributed program component 150, a host interface component 405, a controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for acknowledging the write command and releasing resources.

The method 1100 includes the scheduling component 520 identifying 1130 a partially programmed page nearing the end of its validity period. In one embodiment, the scheduling component 520 scans entries in a partial program table, such as the first partial program table 900 or the second partial program table 920 to identify 1130 a partially programmed page nearing the end of its validity period. In one embodiment, a partially programmed page is considered "near" the end of its validity period when the time remaining of the validity period is less than a threshold amount, e.g., 10 seconds. In response to identifying a partially programmed page for which the time remaining of the validity period is less than a threshold amount, the scheduling component 520 may schedule, e.g., place in a storage operation queue, the second stage of the distributed program operation.

Means for identifying a partially programmed page nearing the end of its validity period may include, in various embodiments, one or more of a distributed program component 150, a scheduling component 520, a controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for identifying a partially programmed page nearing the end of its validity period.

The method 1100 includes the full program component 415 programming 1135 the identified page to a fully programmed state. The method 1100 ends. Because this second stage of the distributed program operation is delayed until the end of the validity period, the host is able to perform one or more intervening storage operations (e.g., such as a read operation and/or another program operation). In certain embodiments, programming 1135 the identified page to a fully programmed state includes the data component 525 searching a cache (e.g., a page buffer, data latch, or internal RAM) for the data included in the write command. In other embodiments, programming 1135 the identified page to a fully programmed state includes the data component 525 reading the values stored in the identified page and decoding the read values using an error correction code in order to derive the data included in the write command.

Means for programming the identified page to a fully programmed state may include, in various embodiments, one or more of a distributed program component 150, a full program component 415, a controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for programming the identified page to a fully programmed state.

Figure 12:
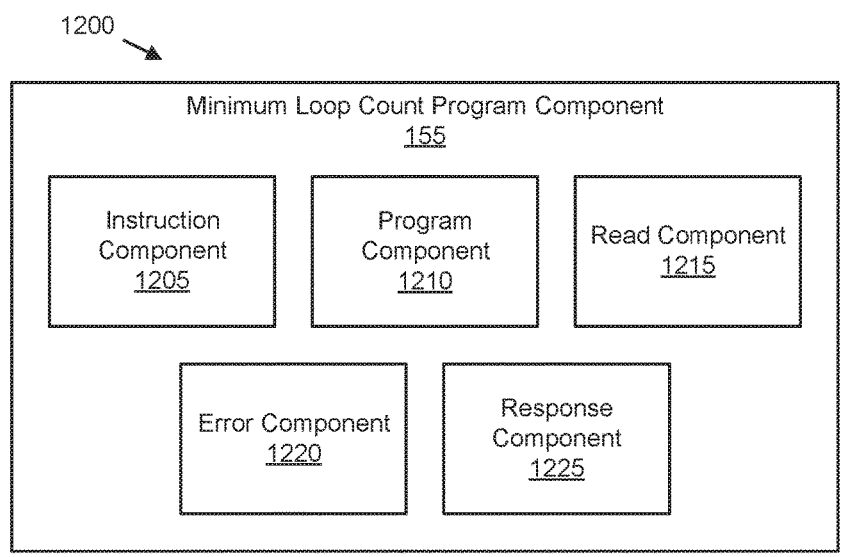
FIG. 12 is a schematic block diagram illustrating one embodiment of a distributed program component for programming to a correctable amount of errors.

FIG. 12 depicts a third apparatus 1200 for programming a page (or other set of non-volatile memory cells) to a correctable amount of errors, according to embodiments of the disclosure. The third apparatus 1200 includes an embodiment of a minimum loop count program component 155, which may be substantially similar to the minimum loop count program component 155 described above with regard to FIG. 1B. In general, as described above, the minimum loop count program component 155 receives the threshold number of bit errors from the non-volatile storage controller and programs data to a page/wordline of non-volatile memory cells over a number of first program pulses. Moreover, the minimum loop count program component 155 analyzes whether an amount of bit errors (e.g., bit flips) in the page of the non-volatile memory cells exceeds the threshold number of bit errors in response to performing the number of first program pulses and continues to program the data to the page of non-volatile memory cells over an additional number of program pulses based on the analysis, e.g., until the amount of bit errors in the page of memory cells no longer exceeds the threshold number of bit errors. In the depicted embodiment, the minimum loop count program component 155 includes an instruction component 1205, a program component 1210, a read component 1215, an error component 1220, and a response component 1225, which are described in more detail below. The components 1205-1225, in one embodiment, are communicatively coupled to one another, for example, via a data communication bus.

The instruction component 1205, in one embodiment, is configured to receive, e.g., from a non-volatile storage controller, a threshold number of bit errors that are correctable by the controller. In one embodiment, the threshold number of bit errors is a parameter of a program operation command. Here, the program operation command includes source data to write to a page of non-volatile memory (or wordline or other suitable set of memory cells). In certain embodiments, the threshold number is based on a die-level page size, e.g., the smallest number of memory cells that can be programmed during a write operation.

In certain embodiments, the instruction component 1205 further receives a maximum number of program pulses from the non-volatile storage controller before the minimum loop count program component 155 is to indicate a program error condition. Moreover, the instruction component 1205 may also receive a number of first program pulses to apply to the page/wordline prior to performing a first program-verify step.

The program component 1210, in one embodiment, is configured to program a page of non-volatile memory (or other set of non-volatile memory cells) with a number of first program pulses. In certain embodiments, the program component 1210 programs the number of first program pulses without the read component 1215 and error component 1220 performing a program-verify step. Thereafter, the read component 1215 and error component 1220 perform a program-verify step after each subsequent program pulse (also referred as an "additional" program pulse).

The read component 1215, in one embodiment, is configured to read data stored to the page (or other set of non-volatile memory cells), e.g., after the number of first program pulses. Moreover, the read component 1215 may provide the read data values to the error component 1220 as part of a program-verify step. The error component 1220, in one embodiment, is configured to analyze (e.g., determine) whether a read number of bit errors exceeds the threshold number of bit errors. In various embodiments, the error component 1220 compares the data values read from the page to the source data to identify the read number of bit errors. If the read number of bit errors exceeds the threshold number of bit errors, then the source data is not (yet) programmed to the page/wordline. Otherwise, if the read number of bit errors does not exceed the threshold number of bit errors, then the source data is sufficiently programmed to the page (or other set of non-volatile memory cells).

Note, that if the read number of bit errors exceeds the threshold number of bit errors, then the program component 1210 programs the page of non-volatile memory with an additional number of program pulses (e.g., until the read number of bit errors does not exceed the threshold number of bit errors). Moreover, the read component 1215 reads data stored to the page after each additional program pulse and the error component 1220 re-determines whether a read number of bit errors exceeds the threshold number of bit errors after each read. However, once the total number of program pulses reaches the maximum number of program pulses, then the minimum loop count program component 155 determines a program error condition if the read number of bit errors still exceeds the threshold number of bit errors.

The response component 1225, in one embodiment, is configured to notify the non-volatile storage controller that the page of non-volatile memory (or other set of non-volatile memory cells) is successfully programmed in response to the read number of bit errors not exceeding the threshold number of bit errors. Additionally, the response component 1225 may report an error condition to the non-volatile storage controller in response to the additional number of program pulses reaching the maximum number of program pulses. In certain embodiments, the response component 1225 further notifies the non-volatile storage controller of the total number of program pulses performed.

In various embodiments, programming the page (or page or other set of non-volatile memory cells) of non-volatile memory to the point where the number of bit errors in the read data no longer exceeds the threshold number of bit errors places the page (or other set of non-volatile memory cells) in a partially programmed state. As discussed above, data that is partially programmed remains valid for a limited amount of time. During the validity period, the minimum loop count program component 155 is able to perform other storage operations, such as program operations, read operations, erase operations, or the like. However, at the end of the validity period the partially programmed data needs to be programmed again, otherwise the partially programmed data will be lost.

In some embodiments, the response component 1225 indicates to the non-volatile storage controller that the page (or other set of non-volatile memory cells) is in a partially programmed state. In certain embodiments, the instruction component 1205 later receives a command from the non-volatile storage controller to program the page to a fully programmed state. In such embodiments, the program component 1210 programs the page with a number of "second" program pulses in response to the command. Here, the "second" program pulses are part of the second programming stage of a distributed program operation. As discussed above, the second program pulses may use a smaller voltage step to avoid program-disturb errors in neighboring pages/wordlines.

In one embodiment, the instruction component 1205 receives the number of second program pulses from the non-volatile storage controller. Moreover, the read component 1215 may read data stored to the page after each second program pulse, and the program component 1210 programs the page until the charge stored to the page meets a set of program verify thresholds (e.g., indicating the page is fully programmed).

Figure 13:
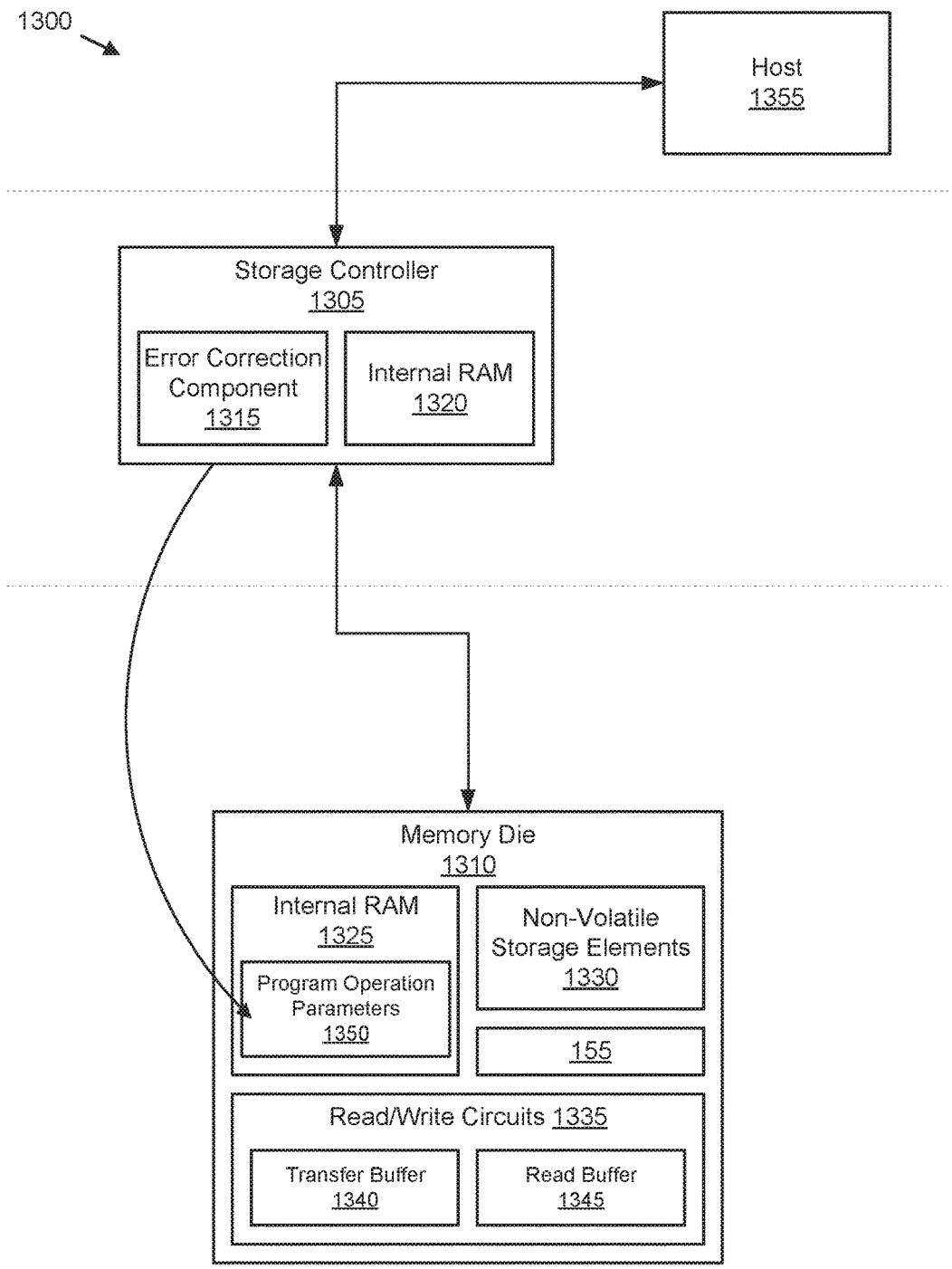
FIG. 13 is a block diagram illustrating one embodiment of a system for programming a correctable page with a minimum program loop count.

FIG. 13 depicts an exemplary non-volatile storage system 1300 for programming a correctable page with a minimum program loop count, according to embodiments of the disclosure. The system includes a storage controller 1305 and a memory die 1310. While only one memory die 1310 is depicted, in other embodiments the non-volatile storage system 1300 may include multiple memory dies 1310.

In the embodiment depicted, the storage controller 1305 includes an error correction component 1315 capable of correcting up to a threshold number of bit errors, such as bit flips, in data read from the memory die 1310. The error correction component 1315 may be an ECC decoder that uses an error correction code, such as LDPC, to correct errors in data read from the non-volatile memory. In other embodiments, the error correction component 1315 may be located apart from the storage controller 1310, for example in the host 1355. In such embodiments, the storage controller may receive the threshold number of bit errors correctable by the error correction component 1315, from the host 1355 and/or the error correction component 1315. In certain embodiments, the storage controller 1305 may also include an amount of internal RAM 1320.

The memory die 1310 also includes an amount of internal RAM 1325. Moreover, the memory die 1310 includes a plurality of non-volatile storage cells 1330 and read/write circuits 1335 for programming data to, and reading data from, the non-volatile storage cells 1330. The read/write circuits 1335 may include a transfer buffer 1340 that holds data to be written to the non-volatile storage cells 1330 and a read buffer 1345 that holds data read from the non-volatile storage cells 1330. In various embodiments, the memory die 1310 includes an instance of the minimum loop count program component 155.

The storage controller 1305 identifies the threshold number of bit errors (e.g., bit flips) that can be corrected in a page of data (e.g., a 4 kB page or other die-level page size), for example using the error correction component 1315. In one embodiment, the storage controller 1305 is pre-programmed with the threshold number of bit errors. In another embodiment, the storage controller 1305 determines the threshold number of bit errors, for example by inquiring the error correction component 1315 or calculating/deriving the threshold number. In other embodiments, the storage controller 1305 receives the threshold number of bit errors from the host 1355. The controller 1305 sends this number to the memory die 1310. Additionally, the storage controller 1305 may determine a number of program loop cycles to perform without verifying a programmed voltage level. In certain embodiments, the storage controller 1305 also determines a maximum number of program loop cycles for a minimum-program-loop-count ("minimum PLC") program operation, such as a partial program operation (e.g., a first stage of the distributed program operation). The storage controller 1305 sends program operation parameters 1350 to the memory die 1310, which stores the program operation parameters 1350 in the internal RAM 1330. The program operation parameters 1350 include at least the threshold number of bit errors, the number of program loop cycles to perform without verifying a programmed voltage level, and the maximum number of program loop cycles for a minimum PLC program operation.

In certain embodiments, the program operation parameters 1350 are communicated with a program operation command. For example, the storage controller 1305 may receive an instruction to write data to an address from the host 1355. The storage controller may select the memory die 1310 based on the address and issue a minimum PLC program operation command to the memory die 1310 that includes the program operation parameters 1350. In other embodiments, the program operation parameters 1350 are communicated separately from a program operation command.

In one embodiment, the storage controller 1305 receives source data corresponding to the program operation command from the host 1355 in 16 kB chunks. For example, the host 1355 may assume a 16 kB page size of the memory die 1310. Here, however, the memory die 1310 may have a smaller (die-level) page size, e.g., 4 kB, such that the 16 kB chunk received from the host 1355 fills an integer number of die-level pages. In another embodiment, the storage controller 1305 receives source data corresponding to the program operation command from the host 1355 in chunks equal to the die-level page size (e.g., 4 kB). Note that the chunk size may be equal to a wordline of SLC memory, in certain implementations.

Having received a program operation command (e.g., including source data received from a host 1355) the memory die 1310 programs data to a page of the non-volatile memory cells (or other set of non-volatile memory cells) over a first number of program loop cycles. In one embodiment, the first number of program loop cycles may be the number of program loop cycles to perform without verifying a programmed voltage level included with the program operation parameters 1350. In another embodiment, the first number of program loop cycles may be a default number of program loop cycles to perform without verifying a programmed voltage level, such as one or two.

After programming the first number of program loop cycles, the memory die 1310 analyses whether an amount of bit flips in the page of the non-volatile memory cells exceeds the threshold number of bit flips in response to performing the first number of program loop cycles. Here, the memory die 1310 reads the page of the non-volatile memory cells to acquire read data. For example, data values read from the page may be stored in the read buffer 1345. Further, the read data may be compared, bit-by-bit, to the source data (contained in the transfer buffer 1340) to determine a number of bit flips in the page, and the number of bit flips compared to the threshold number includes in the program operation parameters 1350.

If the amount of bit flips in the page of memory cells exceeds the threshold number of bit flips, then the memory die 1310 continues to program the page by applying at least one additional program loop cycle. However, once the amount of bit flips in the page of memory cells does not exceed the threshold number of bit flips, then the page is considered programmed with the minimum number of program loop cycles. At this point, the memory die 1310 indicates completion of the program command to the storage controller 1305. Moreover, the memory die 1310 may track the accumulative number of program loop cycles used to program the page and report the accumulative number to the storage controller 1305, e.g., upon indicating completion of the program command. Here, the storage controller 1305 may store (e.g., in internal RAM) the accumulative number and calculate the number of program loop cycles to perform without verifying a programmed voltage level based on the accumulative number of program loop cycles reported by the memory die 1310.

In certain embodiments, the storage controller 1305 marks the page/wordline of non-volatile memory cells as partially programmed in response to the memory die indicating completion of the program command. For example, marking the page/wordline may include storing an indication of the partial programming in a table stored in the internal RAM 1320. As discussed above, various tables may be used to indicate which pages (or wordlines, or LBAs) are partially program and a validity period for each partially programmed page/wordline. At a later point in time, the storage controller 1305 may instruct the memory die 1310 to fully program the page/wordline, e.g., by programming the source data over a second number of program loop cycles. Fully programming the source data is discussed in further detail above.

Figure 14:
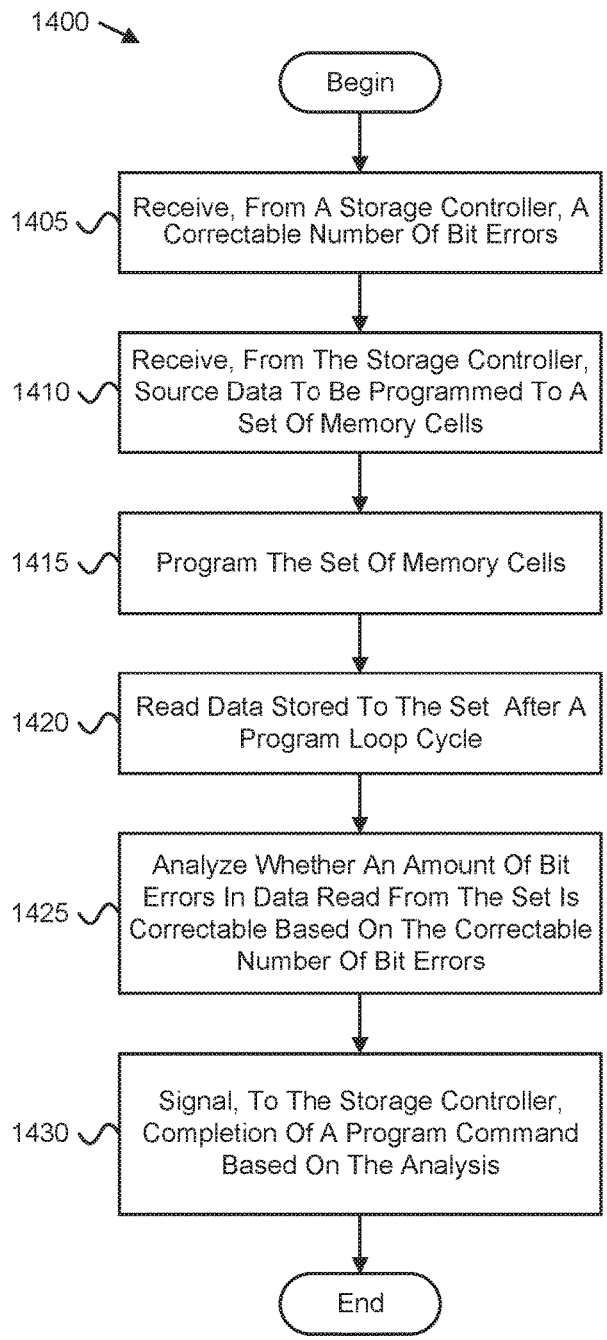
FIG. 14 is a schematic flowchart diagram illustrating a further embodiment of a method for programming to a correctable amount of errors.

FIG. 14 is a schematic flowchart diagram illustrating a method 1400 for programming to a correctible amount of errors, according to embodiments of the disclosure. In one embodiment, the method 1400 begins and the instruction component 1205 receives 1405, from a storage controller, a correctable number of bit errors. Here, the correctable number of bit errors may indicate a number of bit errors per physical/die-level page size, logical page size, or the like that can be corrected using an error correction code, for example by an ECC decoder. In certain embodiments, the correctable number of bit errors is contained in an instruction to write data (e.g., a program operation command) that includes data to be written to a non-volatile memory media 122 and one or more logical block addresses ("LBAs") for the data. In one embodiment, an LBA or other address may be associated with a set of TLC memory cells (e.g., one or more pages, a wordline, or the like).

Means for receiving a correctable number of bit errors, in various embodiments, may include, in various embodiments, one or more of a minimum loop count program component 155, an instruction component 1205, a controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for receiving a correctable number of bit errors.

Additionally, the method 1400 includes the instruction component 1205 receiving 1410, from the storage controller, source data to be programmed to a set of memory cells. Here, the set of memory cells comprises at least one physical/die-level page, the physical/die-level page being the minimum amount (and, optionally, arrangement) of memory cells that the memory die can program at a time. In certain embodiments, the receiving 1410 source data comprises storing the source data in a transfer buffer, such as the XDL buffer or similar set of data latches. In various embodiments, the set of memory cells consists of TLC memory cells.

Means for receiving source data to be programmed to a set of memory cells, in various embodiments, one or more of a minimum loop count program component 155, an instruction component 1205, a controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for receiving source data to be programmed to a set of memory cells.

Additionally, the method 1400 includes the program component 1210 programming 1415 the set of memory cells. Programming 1415 the set of memory cells may comprise using incremental step pulse programming to store the source data to the set of memory cells. More specifically, programming 1415 the set of memory cells may include programming over at least one program loop cycle. In certain embodiments, programming 1415 the set of memory cells comprises programming one or more pages of data. For example, the program component 1210 may program three pages to a wordline of TLC memory cells, thus storing three bits in each memory cell of the wordline.

Means for programming the set of memory cells, in various embodiments, may include, in various embodiments, one or more of a minimum loop count program component 155, a program component 1210, a controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for programming the set of memory cells.

Additionally, the method 1400 includes the read component 1215 reading 1420 data stored to the set of memory cells after a program loop cycle. Here, reading 1420 the data stored to the set of memory cells is a first part of a program-verify step, whereby the level of charge stored to the memory cells is assessed. In one embodiment, reading 1420 the data stored to the set of memory cells comprises performing a "hard" read operation.

In certain embodiments, the instruction component 1205 receives a first number of program loop cycles to apply without verifying the programmed voltage of the set of memory cells. In such embodiments, the program component 1210 applies the first number of program loop cycles before the read component 1215 first reads the data stored to the set of memory cells. Thereafter, the read component 1215 read the data stored to the set of memory cells after each additional program loop cycle.

Means for reading data stored to the set of memory cells after a program loop cycle, in various embodiments, may include, in various embodiments, one or more of a minimum loop count program component 155, a read component 1215, a controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for reading data stored to the set of memory cells after a program loop cycle.

Additionally, the method 1400 includes the error component 1220 analyzing 1425 whether an amount of bit errors in data read from the set of memory cells is correctable based on the correctable number of bit errors. This is a second part of the program-verify step. As discussed above, the set of memory cells may be a wordline, one or more pages, or the like. In various embodiments, analyzing 1425 whether an amount of bit errors in data read from the set of memory cells is correctable includes determining (at the memory die) whether the amount of bit errors in the read data exceeds a threshold amount (e.g., the correctable number of bit errors). Moreover, analyzing 1435 may comprise comparing, on a bit-by-bit level, the data read from the set of memory cells to the source data and counting a number of discrepancies in the two. Here, the number of discrepancies is the amount of bit errors in the read data (e.g., data read from the set of memory cells). In certain embodiments, data values resulting from a "hard" read operation are compared to the source data. If the number of bit errors is above the correctable number of bit errors (received in step 1405), then the data read from the set of memory cells is not correctable. However, if the number of bit errors is less than or equal to the correctable number of bit errors, then the data read from the set of memory cells is correctable (e.g., by the ECC decoder).

Means for analyzing whether an amount of bit errors in data read from the set of memory cells is correctable, in various embodiments, one or more of a minimum loop count program component 155, an error component 1220, a controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for analyzing whether an amount of bit errors in data read from the set of memory cells is correctable.

Additionally, the method 1400 includes the response component 1225 signaling 1430, to the storage controller, completion of a program command based on the analysis. In various embodiments, the response component 1225 signals completion in response to the amount of bit errors in the data being correctable. Thus, if the number of bit errors is less than or equal to the correctable number of bit errors, the response component 1225 signals completion to the storage controller. Otherwise, if the amount of bit errors in the data is not correctable, then the program component 1210 programs the set of non-volatile memory cells for another program loop cycle and another program-verify step is performed (e.g., by the read component 1215 and the error component 1220).

In certain embodiments, the instruction component 1205 further receives a maximum loop count (e.g., a maximum number of program loop cycles) to be applied in the program operation. Here, the if the amount of bit errors in the data is not correctable after the maximum loop count is received, then the response component 1225 indicates a programming error to the storage controller.

Means for signaling completion of a program command, in various embodiments, may include, in various embodiments, one or more of a minimum loop count program component 155, a response component 1225, a controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for signaling completion of a program command.

In some embodiments, signaling 1430 completion of a program command includes notifying the storage controller of a number of program pulses performed until the amount of bit errors in the data being correctable. As discussed above, the storage controller may use this information to calculate the first number of program loop cycles to apply without verifying the programmed voltage of the set of non-volatile memory cells.

Means for notifying the storage controller of a number of program pulses performed, in various embodiments, may include, in various embodiments, one or more of a minimum loop count program component 155, a response component 1225, a controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for notifying the storage controller of a number of program pulses performed.

As used herein, the term "program operation" includes any storage operation to persist a value (digital or analog), or to persist a state which represents a value, on the non-volatile memory device 120. Some examples of other program (or equivalent) operations include, but are not limited to, burning, storing, writing, and setting a persistent value on the non-volatile memory device 120. References herein to a program operation are inclusive of other equivalent or similar operations.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
   a non-volatile storage controller that identifies a threshold number of bit flips that can be corrected in an amount of read data; and
   a memory die comprising a plurality of non-volatile memory cells, wherein the memory die:
   receives the threshold number of bit flips from the non-volatile storage controller;
   programs data to a set of the non-volatile memory cells over a first number of program loop cycles; and
   programs the data to the set of non-volatile memory cells over an additional number of program loop cycles in response to the amount of bit flips in the set of memory cells exceeding the threshold number of bit flips.

2. The apparatus of claim 1, wherein the non-volatile storage controller sends a program command to the memory die, wherein memory die further:
   tracks the accumulative number of program loop cycles used to program the set of non-volatile memory cells;
   indicates completion of the program command in response to the amount of bit flips in the set of memory cells not exceeding the threshold number of bit flips; and reports the accumulative number to the non-volatile storage controller.

3. The apparatus of claim 2, wherein the non-volatile storage controller marks the set of non-volatile memory cells as partially programmed in response to the memory die indicating completion of the program command.

4. The apparatus of claim 1, wherein the memory die analyzes whether an amount of bit flips in the set of the non-volatile memory cells exceeds the threshold number of bit flips in response to performing the first number of program loop cycles.

5. The apparatus of claim 1, wherein the non-volatile storage controller further indicates to the memory die a number of program loop cycles to perform without verifying a programmed voltage level, wherein the first number of program loop cycles is based on the number of program loop cycles to perform without verifying a programmed voltage level.

6. The apparatus of claim 5, wherein the non-volatile storage controller calculates the number of program loop cycles to perform without verifying a programmed voltage level based on an accumulative number of program loop cycles used to program another set of non-volatile memory cells of the memory die.

7. The apparatus of claim 1, wherein the memory die includes a read data buffer, wherein determining whether the amount of bit flips in the set of the non-volatile memory cells exceeds the threshold number of bit flips comprises the memory die reading data from the set of non-volatile memory cells into the read data buffer and comparing the read data buffer to source data received from the non-volatile storage controller.

8. A method comprising:
receiving, at a memory die and from a non-volatile storage controller, a threshold number of bit errors that are correctable by the non-volatile storage controller;
programming, by the memory die, a set of non-volatile memory cells with a number of first program pulses;
reading data stored to the set of non-volatile memory cells after the number of first program pulses;
analyzing, by the memory die, whether a read number of bit errors exceeds the threshold number of bit errors; and
notifying the non-volatile storage controller that the set of non-volatile memory is successfully programmed based on the result of the analysis.

9. The method of claim 8, further comprising:
programming the set of non-volatile memory with an additional number of program pulses in response to the read number of bit errors exceeding the threshold number of bit errors;
reading data stored to the set of non-volatile memory cells after each additional program pulse; and
re-analyzing whether a read number of bit errors exceeds the threshold number of bit errors after each read.

10. The method of claim 9, further comprising receiving a maximum number of program pulses from the non-volatile storage controller, and reporting an error condition to the non-volatile storage controller in response to the additional number of program pulses reaching the maximum number of program pulses.

11. The method of claim 9, further comprising notifying the non-volatile storage controller of the total number of program pulses performed.

12. The method of claim 8, wherein notifying the non-volatile storage controller that the set of non-volatile memory cells is successfully programmed comprises notifying the non-volatile storage controller that the set of non-volatile memory is successfully programmed in response to the read number of bit errors not exceeding the threshold number of bit errors.

13. The method of claim 8, wherein notifying the non-volatile storage controller that the set of non-volatile memory cells is successfully programmed comprises indicating that the set of non-volatile memory cells is in a partially programmed state.

14. The method of claim 13, further comprising receiving a command from the non-volatile storage controller to program the set of non-volatile memory cells to a fully programmed state, and programming the set of non-volatile memory cells with a number of second program pulses in response to the command.

15. The method of claim 14, further comprising receiving the number of second program pulses from the non-volatile storage controller.

16. The method of claim 14, further comprising reading data stored to the set of non-volatile memory cells after each second program pulse, wherein programming the set of non-volatile memory cells with a number of second program pulses comprises programming the set of non-volatile memory cells until the read data reaches a set of program verify thresholds.

17. A memory die apparatus comprising:
means for receiving, from a storage controller, a correctable number of bit errors;
means for receiving, from the storage controller, source data to be programmed to a set of memory cells;
means for programming the set of memory cells;
means for reading data stored to the set after a program loop cycle;
means for analyzing whether an amount of bit errors in data read from the set is correctable based on the correctable number of bit errors; and
means for signaling, to the storage controller, completion of a program command based on the analysis.

18. The apparatus of claim 17, wherein the means for programming the set of memory cells programs the set using an additional number of program loop cycles in response to the amount of bit errors not being correctable.

19. The apparatus of claim 18, further comprising means for receiving a maximum number of program loop cycles from the non-volatile storage controller, wherein programming the set using an additional number of program loop cycles comprises applying up to the maximum number of program loop cycles.

20. The apparatus of claim 17, further comprising means for notifying the storage controller of a number of program pulses performed until the amount of bit errors in the data becomes correctable.

\* \* \* \* \*